(12) United States Patent
Kubota et al.

(10) Patent No.: US 9,954,161 B2
(45) Date of Patent: *Apr. 24, 2018

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Makoto Kubota, Yokohama (JP); Hidenori Tanaka, Yokohama (JP); Takayuki Watanabe, Yokohama (JP); Shunsuke Murakami, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

This patent is subject to a terminal disclaimer.

(21) Appl. No.: 14/575,659

(22) Filed: Dec. 18, 2014

(65) Prior Publication Data

US 2015/0171310 A1 Jun. 18, 2015

(30) Foreign Application Priority Data

Dec. 18, 2013 (JP) .................................. 2013-261504

(51) Int. Cl.
*H01L 41/187* (2006.01)
*H01L 41/083* (2006.01)
(Continued)

(52) U.S. Cl.
CPC ...... *H01L 41/1871* (2013.01); *B41J 2/14233* (2013.01); *H01L 41/083* (2013.01);
(Continued)

(58) Field of Classification Search
CPC . H01L 41/1871; H01L 41/1878; H01L 41/18; H01L 41/1873; C04B 35/4682;
(Continued)

(56) References Cited

U.S. PATENT DOCUMENTS 7,595,975 B2 9/2009 Suzuki et al.
7,944,126 B2 5/2011 Tanaka et al.
(Continued)

FOREIGN PATENT DOCUMENTS

JP 2003-128460 A 5/2003
JP 4039029 B2 1/2008
(Continued)

OTHER PUBLICATIONS

Wu et al., Orthorhombic-tetragonal phase coexistence and piezoelectric behavior in (1-x)(Ba,Ca)(Ti,Sn)O3-x(Ba,Ca)(Ti,Zr)O3 lead-free ceramics, Materials Research Bulletin 48, pp. 4411-4414.*
(Continued)

*Primary Examiner* — Matthew E Hoban
*Assistant Examiner* — Lynne Edmondson
(74) *Attorney, Agent, or Firm* — Canon U.S.A. Inc., IP Division

(57) ABSTRACT

A piezoelectric material contains a perovskite-type metal oxide represented by general formula (1) as a main component:

$(Ba_{1-x-y}Ca_xSn_y)_\alpha(Ti_{1-z}Zr_z)O_3$   General formula (1)

(where $0.020 \le x \le 0.200$, $0.020 \le y \le 0.200$, $0.050 < z \le 0.085$, $0.986 \le \alpha \le 1.100$).

30 Claims, 15 Drawing Sheets

(51) Int. Cl.
    *B41J 2/14*     (2006.01)
    *H01L 41/09*     (2006.01)
    *H02N 2/10*     (2006.01)
    *H02N 2/16*     (2006.01)
    *H01L 41/047*     (2006.01)

(52) U.S. Cl.
    CPC ......... *H01L 41/0973* (2013.01); *H02N 2/106* (2013.01); *H02N 2/163* (2013.01); *B41J 2202/03* (2013.01); *H01L 41/0471* (2013.01); *H01L 41/0477* (2013.01)

(58) Field of Classification Search
    CPC ...... C04B 2235/3236; C04B 2235/768; C04B 2235/77
    USPC ...................... 252/62.9 PZ, 62.9 R; 310/358; 501/135–139
    See application file for complete search history.

(56) References Cited

U.S. PATENT DOCUMENTS

| | | | |
|---|---|---|---|
| 7,963,640 | B2 | 6/2011 | Tokunaga et al. |
| 9,144,971 | B2 * | 9/2015 | Watanabe ............ B41J 2/14201 |
| 9,159,903 | B2 * | 10/2015 | Oshima ............... B41J 2/14233 |
| 9,166,140 | B2 * | 10/2015 | Tanaka ............... H01L 41/0973 |
| 9,190,602 | B2 * | 11/2015 | Kubota ................ H01L 41/083 |
| 9,240,542 | B2 * | 1/2016 | Saito ................... H01L 41/1871 |
| 9,520,549 | B2 * | 12/2016 | Tanaka ................ B41J 2/14233 |
| 9,525,123 | B2 * | 12/2016 | Uebayashi ............. B32B 18/00 |
| 9,537,081 | B2 * | 1/2017 | Oshima .................. B32B 18/00 |
| 2015/0171310 | A1 * | 6/2015 | Kubota ............... B41J 2/14233 252/62.9 PZ |

FOREIGN PATENT DOCUMENTS

| | | |
|---|---|---|
| JP | 2009-215111 A | 9/2009 |
| JP | 2010161286 A | 7/2010 |
| JP | 2010219509 A | 9/2010 |
| JP | 2011068516 A | 4/2011 |
| JP | 2013032267 A | 2/2013 |
| JP | 5217997 B2 | 6/2013 |
| JP | 2013191751 A | 9/2013 |
| JP | 2013216565 A | 10/2013 |
| JP | 2013219316 A | 10/2013 |
| WO | 2005075377 A1 | 8/2005 |
| WO | 2008004393 A1 | 1/2008 |
| WO | 2008068999 A1 | 6/2008 |
| WO | 2012043208 A1 | 4/2012 |

OTHER PUBLICATIONS

Yoon et al., "Effects of A-site Ca and B-site Zr substitution on dielectric properties and microstructure in tin-doped BaTiO3—CaTiO3 composites", Aug. 10, 2007, Ceramics International 34, pp. 1941-1948.*

U.S. Appl. No. 14/575,780, filed Dec. 18, 2014, Makoto Kubota et al.

U.S. Appl. No. 14/575,920, filed Dec. 18, 2014, Makoto Kubota et al.

Xue et al., "Elastic, piezoelectric, and dielectric properties of Ba(Zr0.2Ti0.8)O3-50(Ba0.7Ca0.3)TiO3 Pb-free ceramic at the morphotropic phase boundary", Journal of Applied Physics (2011), vol. 109, pp. 054110-1 to 054110-6.

Lin et al., "Effects of Mn doping on structural and dielectric properties of sol-gel derived (BaO.835CaO.165) (ZrO.09TiO.0.91)O3 thin films", Apr. 6, 2012, Thin Solid Films, 520, pp. 5146-5150.

* cited by examiner

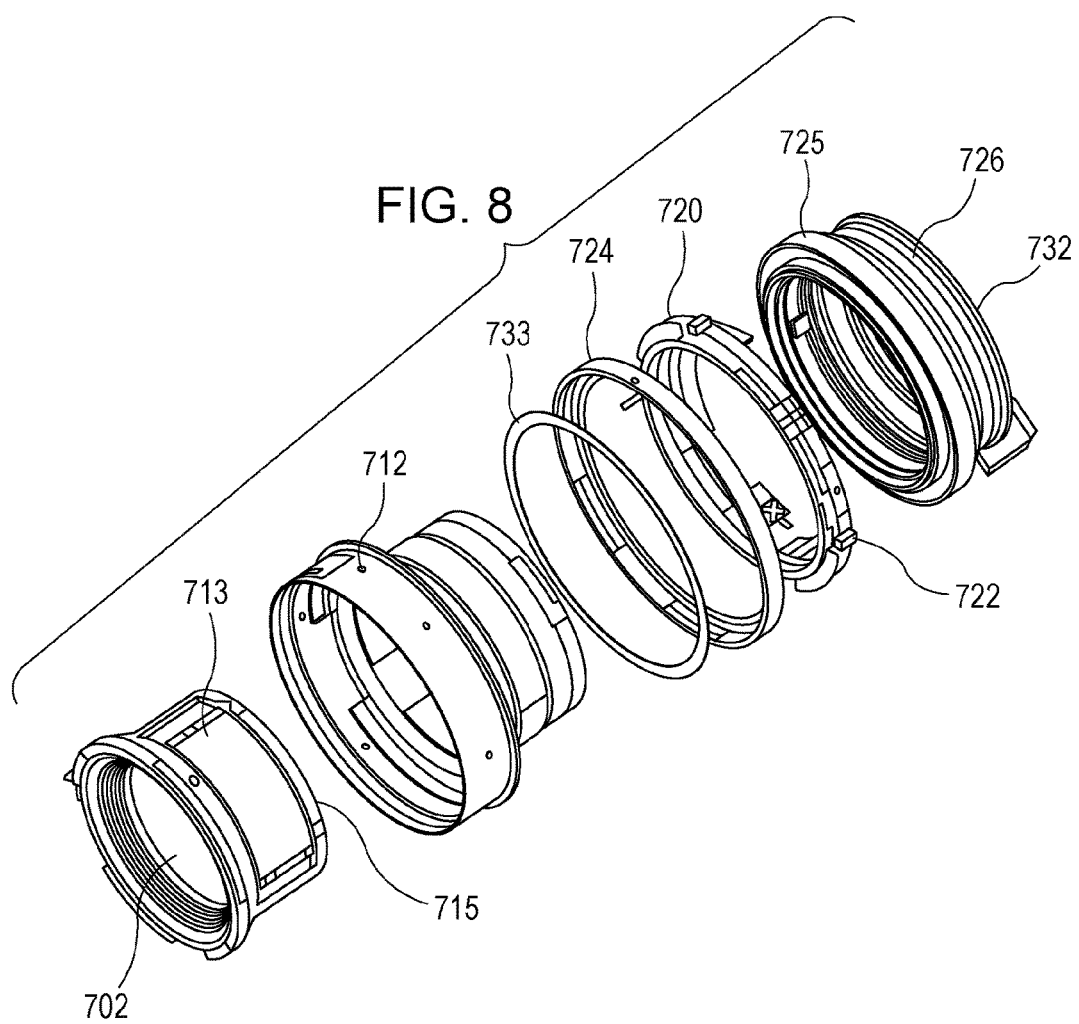

PIEZOELECTRIC MATERIAL, PIEZOELECTRIC ELEMENT, AND ELECTRONIC APPARATUS

BACKGROUND OF THE INVENTION

Field of the Invention

The present invention relates to a piezoelectric material, and in particular, to a lead-free piezoelectric material. The present invention also relates to a piezoelectric element, a multilayered piezoelectric element, a liquid ejection head, a liquid ejection apparatus, an ultrasonic motor, an optical apparatus, a vibration apparatus, a dust removing device, an image pickup device, and an electronic apparatus, all of which use the piezoelectric material.

Description of the Related Art

Typical piezoelectric materials are $ABO_3$ perovskite-type metal oxides such as lead zirconate titanate (hereinafter referred to as "PZT"). However, PZT contains lead in the A-site of the perovskite skeleton. Therefore, the effect of the lead component on the environment has been regarded as a problem. In order to address this problem, piezoelectric materials and piezoelectric elements that include lead-free perovskite-type metal oxides have been proposed.

Examples of the piezoelectric materials that contain a lead-free perovskite-type oxide include barium titanate (Ba-$TiO_3$) and derivatives thereof. Japanese Patent No. 5217997 discloses a piezoelectric material in which some of the A-sites of barium titanate are substituted with calcium (Ca) and some of the B-sites of barium titanate are substituted with manganese (Mn), iron (Fe), or copper (Cu). The piezoelectric material has an improved temperature-dependent stability of piezoelectric properties at around room temperature and an improved mechanical quality factor, and a piezoelectric element including the piezoelectric material is also disclosed. The improvement in the mechanical quality factor is effective to reduce heat generation during driving of a piezoelectric element and to reduce the power consumption of the piezoelectric element. However, there may be a problem in that the piezoelectric properties of the piezoelectric material disclosed in Japanese Patent No. 5217997 are lower than those of unsubstituted barium titanate ($BaTiO_3$).

As other examples, Japanese Patent Laid-Open No. 2009-215111 and the "Journal of Applied Physics" 2011, Vol. 109, 054110-1 to 054110-6 disclose piezoelectric materials in which piezoelectric properties are improved by substituting some of the A-sites of barium titanate with calcium (Ca) and substituting some of the B-sites thereof with zirconium (Zr). These piezoelectric materials have a low Curie temperature of 80° C. or lower and cause depolarization in a high-temperature environment, for example, in a car in the summer, resulting in a problem of a decrease in piezoelectric properties thereof. In general, piezoelectric properties of a piezoelectric element that has been subjected to a polarization treatment are significantly decreased by depolarization at a temperature 10° C. to 20° C. lower than the Curie temperature. In addition, the piezoelectric material disclosed in Japanese Patent Laid-Open No. 2009-215111 has a small mechanical quality factor.

The present invention provides a lead-free piezoelectric material having a high piezoelectric constant in a wide operating temperature range. The present invention further provides a piezoelectric element, a multilayered piezoelectric element, a liquid ejection head, a liquid ejection apparatus, an ultrasonic motor, an optical apparatus, a vibration apparatus, a dust removing device, an image pickup device, an electronic apparatus, etc., all of which use the piezoelectric material.

SUMMARY OF THE INVENTION

A first aspect of the present invention provides a piezoelectric material containing a perovskite-type metal oxide represented by general formula (1) as a main component.

$$(Ba_{1-x-y}Ca_xSn_y)_\alpha(Ti_{1-z}Zr_z)O_3 \qquad \text{General formula (1)}$$

(where $0.020 \leq x \leq 0.200$, $0.020 \leq y \leq 0.200$, $0.050 < z \leq 0.085$, $0.986 \leq \alpha \leq 1.100$)

A second aspect of the present invention provides a piezoelectric element including a first electrode, a piezoelectric material portion, and a second electrode, in which the piezoelectric material portion is composed of the piezoelectric material, the piezoelectric material portion has a region sandwiched between the first electrode and the second electrode, and a part or the whole of the region has remanent polarization.

A third aspect of the present invention provides a multilayered piezoelectric element including a plurality of piezoelectric material layers and a plurality of electrode layers including an internal electrode, the piezoelectric material layers and the electrode layers being alternately stacked, in which the piezoelectric material layers are composed of the piezoelectric material, the piezoelectric material layers each have a region sandwiched between the electrode layers, and a part or the whole of the region has remanent polarization.

A fourth aspect of the present invention provides a liquid ejection head including a liquid chamber including a vibration unit that includes the piezoelectric element or the multilayered piezoelectric element, and an ejection port in communication with the liquid chamber.

A fifth aspect of the present invention provides a liquid ejection apparatus including a stage configured to receive an object, and the liquid ejection head.

A sixth aspect of the present invention provides an ultrasonic motor including a vibrating member that includes the piezoelectric element or the multilayered piezoelectric element, and a moving member that is in contact with the vibrating member.

A seventh aspect of the present invention provides an optical apparatus including a driving unit including the ultrasonic motor.

An eighth aspect of the present invention provides a vibration apparatus including a vibrating member including a diaphragm and the piezoelectric element or the multilayered piezoelectric element, the piezoelectric element or the multilayered piezoelectric element being disposed on the diaphragm.

A ninth aspect of the present invention provides a dust removing device including a vibration unit including the vibration apparatus.

A tenth aspect of the present invention provides an image pickup device including the dust removing device and an image pickup element unit, in which a diaphragm of the dust removing device is disposed on a light-receiving surface side of the image pickup element unit.

An eleventh aspect of the present invention provides an electronic apparatus including a piezoelectric acoustic component including the piezoelectric element or the multilayered piezoelectric element.

According to the aspects of the present invention, a lead-free piezoelectric material having a high piezoelectric constant in a wide operating temperature range can be provided.

Furthermore, according to the aspects of the present invention, it is possible to provide a piezoelectric element, a multilayered piezoelectric element, a liquid ejection head, a liquid ejection apparatus, an ultrasonic motor, an optical apparatus, a vibration apparatus, a dust removing device, an image pickup device, and an electronic apparatus, all of which use the piezoelectric material.

Further features of the present invention will become apparent from the following description of exemplary embodiments with reference to the attached drawings.

BRIEF DESCRIPTION OF THE DRAWINGS

FIG. 8 is a schematic view showing an optical apparatus according to an embodiment of the present invention.

DESCRIPTION OF THE EMBODIMENTS

Figure 1A:
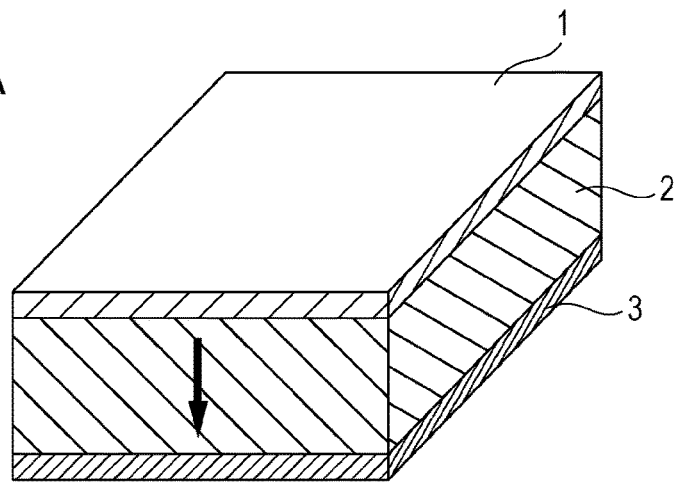
FIGS. 1A to 1C are each a schematic view showing a structure of a piezoelectric element according to an embodiment of the present invention.

Embodiments of the present invention will now be described.

A piezoelectric material according to an embodiment of the present invention contains, as a main component, a perovskite-type metal oxide represented by general formula (1).

$$(Ba_{1-x-y}Ca_xSn_y)_\alpha(Ti_{1-z}Zr_z)O_3 \qquad \text{General formula (1)}$$

(where $0.020 \leq x \leq 0.200$, $0.020 \leq y \leq 0.200$, $0.050 < z \leq 0.085$, $0.986 \leq \alpha \leq 1.100$)

Perovskite-type Metal Oxide

Herein, the term "perovskite-type metal oxide" refers to a metal oxide having a perovskite structure which is ideally a cubic crystal structure, as described in Iwanami Rikagaku Jiten (Iwanami dictionary of physics and chemistry), 5th edition (Iwanami Shoten, Publishers, published Feb. 20, 1998). A metal oxide having a perovskite structure is usually represented by a chemical formula of $ABO_3$. In a perovskite-type metal oxide, element A and element B are respectively present in the form of ions and occupy particular positions in a unit cell, the positions being called the A-sites and the B-sites. For example, in a unit cell of a cubic crystal system, element A is located at vertices of the cube and element B is located at the body-centered position of the cube. Element oxygen (O) is present in the form of an anion of oxygen and occupies face-centered positions of the cube. When the coordinates of element A, element B, and element oxygen (O) are respectively slightly shifted from their symmetry sites of the unit cell, the unit cell of the perovskite structure is distorted to form a crystal system such as a tetragonal system, a rhombohedral system, or an orthorhombic system.

In the metal oxide represented by general formula (1), metal elements that are located at the A-sites are divalent barium (Ba), calcium (Ca), and tin (Sn) and a metal element or metal elements that are located at the B-sites is only titanium (Ti) or titanium (Ti) and zirconium (Zr). The piezoelectric material according to an embodiment of the present invention may contain strontium (Sr) in a similar proportion to that contained in a Ba raw material and may contain hafnium (Hf) and niobium (Nb) in similar proportions to those contained in a Ti raw material.

In general formula (1), the molar ratio of the B-site elements to oxygen (O) is 1:3. However, even when the molar ratio of the amounts of elements is slightly deviated therefrom (for example, 1.00:2.94 to 1.00:3.06), a metal oxide having such a molar ratio is also covered by the scope of the present invention as long as the metal oxide has a perovskite structure as a main phase.

Whether the metal oxide has a perovskite structure or not can be determined by, for example, structural analysis by X-ray diffraction or electron beam diffraction.

Form of Piezoelectric Material

The form of the piezoelectric material according to an embodiment of the present invention is not limited, and may be any of a ceramic, a powder, a single crystal, a film, a slurry, or the like. However, the form of the piezoelectric material is preferably a ceramic. Herein, the term "ceramic" refers to an aggregate (also referred to as bulk) of crystal grains that are composed of a metal oxide serving as a basic component and that are sintered by heat treatment, that is, a so-called polycrystal. The term "ceramic" also refers to a ceramic that has been processed after sintering.

Main Component of Piezoelectric Material

In the metal oxide represented by general formula (1), some of Ba atoms of perovskite-type barium titanate are substituted with Ca and Sn atoms. Some of Ti atoms of the barium titanate are substituted with Zr atoms in an amount of more than 5% by mole. By a synergistic effect of the substitution of the plurality of elements, piezoelectric properties of the piezoelectric material according to an embodiment of the present invention can be significantly improved while suppressing a decrease in the depolarization temperature of barium titanate. The crystal system of the perovskite-type metal oxide represented by general formula (1) is preferably a tetragonal crystal structure at room temperature because good piezoelectric properties are obtained.

In general formula (1), $\alpha$, which represents a ratio of the amount of moles of Ba, Ca, and Sn in the A-sites to the amount of moles of Ti and Zr in the B-sites, is in the range of $0.986 \leq \alpha \leq 1.100$. When $\alpha$ is smaller than 0.986, abnormal grain growth easily occurs in the crystal grains of the piezoelectric material according to an embodiment of the present invention and the mechanical strength of the piezoelectric material decreases. When $\alpha$ is larger than 1.100, the temperature necessary for the grain growth becomes excessively high, sintering cannot be performed in a common firing furnace. Herein, the phrase "sintering cannot be performed" means that the density does not reach a sufficient value or the piezoelectric material is in a state in which a large number of pores and defects are present therein.

In general formula (1), x, which represents the molar ratio of Ca in the A-sites is in the range of $0.020 \leq x \leq 0.200$. When some of Ba atoms of perovskite-type barium titanate are substituted with Ca atoms in the above range, the phase transition temperature between the orthorhombic system and the tetragonal system is shifted to the low-temperature side. Thus, stable piezoelectric properties can be obtained in a driving temperature range of a piezoelectric element using the piezoelectric material according to an embodiment of the present invention. However, when x is larger than 0.200, piezoelectric properties of the piezoelectric material are not sufficient. When x is smaller than 0.020, a temperature-dependent change in piezoelectric characteristics is increased in a driving temperature range of the piezoelectric element using the piezoelectric material according to an embodiment of the present invention. When the amount of Ca is small, stability of a solid-solution state of Sn in the A-sites is impaired, thereby decreasing the effect of substitution with Sn.

In general formula (1), y, which represents the molar ratio of Sn in the A-sites is in the range of $0.020 \leq y \leq 0.200$. When some Ba atoms of perovskite-type barium titanate are substituted with Sn atoms in the above range, distortion of the perovskite structure in the polarization direction increases, and thus the depolarization temperature of the piezoelectric material is improved by 20° C. to 60° C. As a result, it is possible to obtain a piezoelectric material having good piezoelectric properties in a wide operating temperature range. In general, when the B-sites of barium titanate are substituted with Zr, the depolarization temperature tends to lower. However, when an appropriate amount of the A-sites of barium titanate is substituted with Sn, as in the present invention, a synergistic effect is generated in Sn and Zr, and the decrease in the depolarization temperature is suppressed. However, when y is larger than 0.200, insulation properties and piezoelectric properties of the piezoelectric material are not sufficient. When y is smaller than 0.020, the depolarization temperature of the piezoelectric material is rather decreased.

In general formula (1), z, which represents the molar ratio of Zr in the B-sites is in the range of $0.050 < z \leq 0.085$. When some of the Ti sites are substituted with Zr in the above range, the tetragonal distortion of the piezoelectric material decreases. Accordingly, a ratio c/a decreases and is close to 1, and high piezoelectric characteristics can be obtained. The molar ratio z is more preferably in the range of $0.055 \leq z \leq 0.085$. When z is 0.050 or less, the effect of improving piezoelectric properties is not sufficient. When z is larger than 0.085, the depolarization temperature decreases and an operating temperature range is narrow.

Herein, the term "depolarization temperature (also represented by $T_d$)" is defined as follows. When a sufficient time has elapsed after a polarization treatment is performed, the temperature is increased from room temperature to a certain temperature $T_d$ (° C.) and then decreased to room temperature. In this case, a temperature at which a piezoelectric constant becomes smaller than a piezoelectric constant before the temperature increase is referred to as the depolarization temperature. Herein, a temperature at which the piezoelectric constant becomes less than 90% of the piezoelectric constant before the temperature increase is referred to as the depolarization temperature $T_d$.

The method for determining the composition of the piezoelectric material according to an embodiment of the present invention is not particularly limited. Examples of the method include X-ray fluorescence analysis (XRF), inductively coupled plasma (ICP) emission spectroscopy, and atomic absorption spectroscopy. The weight ratio and the composition ratio of the elements contained in the piezoelectric material can be calculated by any of these methods.

First Sub-Component of Piezoelectric Material

The piezoelectric material according to an embodiment of the present invention may contain Mn as a sub-component in an amount of 0.04 parts by weight or more and 0.40 parts by weight or less relative to 100 parts by weight of the metal oxide represented by general formula (1) in terms of metal. The content of the sub-component "in terms of metal" is represented by a ratio determined as follows. The contents of elements contained in the metal oxide represented by general formula (1) are calculated in terms of oxide on the basis of the metal contents determined by measuring the piezoelectric material by XRF, ICP emission spectroscopy, atomic absorption spectroscopy, or the like. The total weight of the above contents of elements in terms of oxide is assumed to be 100. In this case, the content of the sub-component is represented by a ratio of the weight of Mn metal to the total weight.

When the contents of elements are calculated in terms of oxide, the crystal structure is specified in advance by an X-ray diffraction experiment or the like (for example, perovskite structure), the number of oxygen atoms is calculated on the basis of the specified crystal structure and the analytical results of the contents of the metals. In the case of an oxide having a perovskite structure, the oxide is usually represented by a composition formula $ABO_3$. However, from the viewpoint of charge balance etc., the number of oxygen atoms calculated may be shifted by several percent.

When the piezoelectric material contains Mn in an amount in the above range, insulation properties and a mechanical quality factor are improved without impairing piezoelectric properties over the entire driving temperature range of the piezoelectric material. Herein, the term "mechanical quality factor" refers to a factor that represents an elastic loss caused by oscillation when a piezoelectric material is evaluated as an oscillator. The magnitude of the mechanical quality factor is observed as a sharpness of a resonance curve in an impedance measurement. That is, the mechanical quality factor is a factor that represents the sharpness of the resonance of an oscillator. When the insulation properties and the mechanical quality factor of a piezoelectric material are improved, long-term reliability during driving of a piezoelectric element using the piezoelectric material can be ensured.

When the Mn content is less than 0.04 parts by weight, the improvement in the insulation properties and the mechanical quality factor may not be achieved compared with a piezoelectric element according to an embodiment of the present invention that does not contain Mn. When the Mn content exceeds 0.40 parts by weight, the insulation properties and the piezoelectric constant may be decreased compared with a piezoelectric element according to an embodiment of the present invention that does not contain Mn. The Mn content is more preferably in the range of 0.08 parts by weight or more and 0.30 parts by weight or less. When the resistivity of the piezoelectric element according to an embodiment of the present invention is GΩ·cm or more, a leakage current in a polarization treatment can be suppressed, and a leakage current in driving the piezoelectric element can also be suppressed. The resistivity is more preferably 30 GΩ·cm or more. The mechanical quality factor of the piezoelectric material according to an embodiment of the present invention is preferably 400 or more and more preferably 600 or more. When a piezoelectric material having a mechanical quality factor of less than 400 is used in a piezoelectric element, the power consumption during resonant driving of the element may be increased.

Some or all of the Mn atoms are preferably present in the B-sites of the perovskite-type metal oxide represented by general formula (1). The valence of Mn is preferably 4+. In general, Mn can have a valence of 4+, 2+, or 3+. In the case where conduction electrons are present in crystals (for example, in the case where oxygen defects are present in crystals or in the case where the A-sites are occupied by a donor element), the valence of Mn is decreased from 4+ to, for example, 3+ or 2+, thereby trapping the conduction electrons. Thus, insulation properties of a piezoelectric element can be improved. In view of the ionic radius, Ti, which is a main component of the B-sites, can be easily substituted with Mn having a valence of 4+. When the valence of Mn is lower than 4+, for example, 2+, Mn functions as an acceptor. When Mn is present as an acceptor in a perovskite-structure crystal, a hole is generated in the crystal or an oxygen vacancy is formed in the crystal. When Mn atoms each have a valence of 2+ or 3+, holes cannot be completely compensated for only by the introduction of oxygen vacancies, resulting in a decrease in the insulation properties of a piezoelectric element. Accordingly, most of the Mn atoms preferably have a valence of 4+.

Second Sub-Component of Piezoelectric Material

The piezoelectric material according to an embodiment of the present invention may contain, as a sub-component, 0.10 parts by weight or less of Mg in terms of metal relative to 100 parts by weight of the metal oxide represented by general formula (1). The content of the sub-component "in terms of metal" is represented by a ratio determined as follows. The contents of elements contained in the metal oxide represented by general formula (1) are calculated in terms of oxide on the basis of the metal contents determined by measuring the piezoelectric material by XRF, ICP emission spectroscopy, atomic absorption spectroscopy, or the like. The total weight of the above contents of elements in terms of oxide is assumed to be 100. In this case, the content of the sub-component is represented by a ratio of the weight of Mg metal to the total weight. When the piezoelectric material contains Mg in an amount in the above range, the mechanical quality factor is improved. When the Mg content is higher than 0.10 parts by weight, the effect of improving the mechanical quality factor is not expected and the mechanical quality factor may be decreased instead. From the viewpoint of particularly increasing the effect of improving the mechanical quality factor, the Mg content is more preferably 0.05 parts by weight or less.

The form of magnesium is not limited to metallic Mg as long as magnesium is contained as a Mg component in the piezoelectric material. For example, magnesium may be dissolved in the A-sites or the B-sites of the perovskite structure or may be contained at grain boundaries. Alternatively, a Mg component may be contained in the piezoelectric material in the form of a metal, an ion, an oxide, a metal salt, a complex, or the like.

Other Sub-components

The piezoelectric material according to an embodiment of the present invention may contain components (hereinafter referred to as "third sub-components") other than the metal oxide represented by general formula (1), Mn, and Mg within a range where the properties are not changed. The total content of the third sub-components is preferably 1.2 parts by weight or less relative to 100 parts by weight of the metal oxide represented by general formula (1). When the total content of third sub-components exceeds 1.2 parts by weight, the piezoelectric properties and insulation properties of the piezoelectric material may be degraded. The content of a metal element other than Ba, Ca, Sn, Ti, Zr, Mn, and Mg among the sub-components is preferably 1.0 part by weight or less in terms of oxide or 0.9 parts by weight or less in terms of metal relative to the piezoelectric material. Herein, the term "metal elements" covers semimetal elements such as Si, Ge, and Sb. When the content of a metal element other than Ba, Ca, Sn, Ti, Zr, Mn, and Mg among the third sub-components exceeds 1.0 part by weight in terms of oxide or 0.9 parts by weight in terms of metal relative to the piezoelectric material, the piezoelectric properties and insulation properties of the piezoelectric material may be significantly degraded. The total of Li, Na, and Al elements among the third sub-components is preferably 0.5 parts by weight or less in terms of metal relative to the piezoelectric material. When the total of Li, Na, and Al elements among the third sub-components exceeds 0.5 parts by weight in terms of metal relative to the piezoelectric material, sintering may become insufficient. The total of Y and V elements among the third sub-components is preferably 0.2 parts by weight or less in terms of metal relative to the piezoelectric material. When the total of Y and V elements among the third sub-components exceeds 0.2 parts by weight in terms of metal relative to the piezoelectric material, it may be difficult to perform a polarization treatment. Examples of the third sub-components include sintering aids such as Si and Cu. The piezoelectric material according to an embodiment of the present invention may contain Sr in a similar proportion to that contained as an inevitable component in commercially available raw materials of Ba and Ca. Similarly, the piezoelectric material may contain Nb in a similar proportion to that contained as an inevitable component in a commercially available raw material of Ti and may contain Hf in a similar proportion to that contained as an inevitable component in a commercially available raw material of Zr. A method for measuring parts by weight of the third sub-components is not particularly limited. Examples of the method include X-ray fluorescence analysis, ICP emission spectroscopy, and atomic absorption spectroscopy.

Grain Size and Equivalent Circle Diameter of Crystal Grain

An average equivalent circle diameter of crystal grains of the piezoelectric material according to an embodiment of the present invention is preferably 0.3 μm or more and 10 μm or less. When the average equivalent circle diameter of crystal grains of the piezoelectric material is in this range, the piezoelectric material can have good piezoelectric properties and a good mechanical strength. When the average equivalent circle diameter of crystal grains is less than 0.3 μm, sufficient piezoelectric properties may not be obtained. When the average equivalent circle diameter of crystal grains is more than 10 μm, the mechanical strength may be decreased. The average equivalent circle diameter of crystal grains is more preferably 1 μm or more and 5 μm or less.

Among crystal grains of the piezoelectric material, a ratio of the number of crystal grains having an equivalent circle diameter of 25 μm or less is preferably 99% or more. That is, crystal grains having an equivalent circle diameter of 25 μm or less occupy the most part. When the ratio of the number of crystal grains having an equivalent circle diameter of 25 μm or less is in this range, the piezoelectric material according to an embodiment of the present invention can have a good mechanical strength. The mechanical strength has a strong negative correlation with the ratio of crystal grains having a large equivalent circle diameter. When the ratio of the number of crystal grains having an equivalent circle diameter of 25 μm or less is less than 99%, the ratio of grains having an equivalent circle diameter of more than 25 μm is high and thus the mechanical strength may be decreased.

The piezoelectric material may include a needle crystal having a long side of more than 25 μm. Similarly, in this case, when the size of the crystal is converted into an equivalent circle diameter, a ratio of the number of crystals having an equivalent circle diameter of 25 μm or less is preferably 99% or more.

Herein, the term "equivalent circle diameter" refers to a "projected area equivalent circle diameter" which is generally known in microscopy, and represents the diameter of a perfect circle having the same area as the projected area of a crystal grain. In the present invention, the method for measuring this equivalent circle diameter is not particularly limited. For example, the equivalent circle diameter may be determined by obtaining a photograph image of a surface of a piezoelectric material with a polarizing microscope or a scanning electron microscope, and then processing the image. Since the optimum magnification differs depending on the grain size to be analyzed, an optical microscope and an electron microscope may be properly used. Alternatively, the equivalent circle diameter may be determined from an image of a polished surface or a cross section instead of a surface of a material.

Relative Density

The piezoelectric material according to an embodiment of the present invention preferably has a relative density of 93% or more and 100% or less. The term "relative density" refers to a ratio of an actually measured density to a theoretical density calculated from a lattice constant of the piezoelectric material and the atomic weights of elements constituting the piezoelectric material. The lattice constant can be measured by, for example, X-ray diffractometry. The density can be measured by, for example, the Archimedes method. When the relative density is lower than 93%, sufficient piezoelectric properties and a sufficient mechanical quality factor may not be obtained and insulation properties may decrease. The lower limit of the relative density is more preferably 94% or more, and still more preferably 95% or more.

Method for Producing Piezoelectric Material

A method for producing the piezoelectric material according to an embodiment of the present invention is not particularly limited.

Raw Materials of Piezoelectric Material

In producing a piezoelectric material, it is possible to employ a typical solid-phase sintering method in which a mixture of raw materials such as oxides, carbonates, nitrates, and oxalates that contain constituent elements of the target piezoelectric material is sintered at normal pressure. The raw materials preferably have high purities. Powders and liquids of metal oxides and metal salts that constitute the piezoelectric material can be used as the raw materials. Examples of the raw materials include metal compounds such as Ba compounds, Ca compounds, Ti compounds, Sn compounds, Zr compounds, Mg compounds, and Mn compounds.

Examples of the Ba compounds that can be used include barium oxide, barium carbonate, barium oxalate, barium acetate, barium nitrate, barium titanate, barium zirconate, and barium zirconate titanate. Commercially available Ba compounds having high purities (for example, purity of 99.99% or more) are preferably used as the Ba compounds. Barium (Ba) compounds having low purities contain a high content of Mg, and thus the mechanical quality factor of the resulting piezoelectric material may be decreased.

Examples of the Ca compounds that can be used include calcium oxide, calcium carbonate, calcium oxalate, calcium acetate, calcium titanate, calcium zirconate, and calcium zirconate titanate. Commercially available Ca compounds having high purities (for example, purity of 99.99% or more) are preferably used as the Ca compounds. Calcium (Ca) compounds having low purities contain a high content of Mg, and thus the mechanical quality factor of the resulting piezoelectric material may be decreased.

Examples of the Sn compounds that can be used include tin oxide, barium stannate, barium stannate titanate, and calcium stannate. Commercially available Sn compounds having high purities (for example, purity of 99.99% or more) are preferably used as the Sn compounds. In general formula (1), tin (Sn) is present in the A-sites in the form of divalent Sn atoms. Therefore, a compound of Sn whose valence is 2 is preferably selected as the Sn compound used as the raw material. Alternatively, a raw material containing tetravalent Sn may be reduced so that the tetravalent Sn becomes divalent Sn in a reducing atmosphere containing a hydrogen-nitrogen mixed gas at an oxygen partial pressure of $1.0 \times 10^{-10}$ to $1.0 \times 10^{-12}$ MPa, and the reduced raw material may be used.

Examples of the Ti compounds that can be used include titanium oxide, barium titanate, barium zirconate titanate, and calcium titanate.

Examples of the Zr compounds that can be used include zirconium oxide, barium zirconate, barium zirconate titanate, and calcium zirconate.

Perovskite-type metal oxide powders such as a $BaTiO_3$ powder, a $CaTiO_3$ powder, a $BaZrO_3$ powder, and a $CaZrO_3$ powder may be used as the raw materials.

Examples of the Mn compounds that can be used include manganese carbonate, manganese oxide, manganese dioxide, manganese acetate, and trimanganese tetraoxide.

Examples of the Mg compounds that can be used include magnesium carbonate, magnesium oxide, magnesium hydroxide, magnesium peroxide, and magnesium chloride.

A raw material used for adjusting α, which represents a ratio of the molar amount of Ba, Ca, and Sn in the A-sites to the molar amount of Ti and Zr in the B-sites of the piezoelectric material, is not particularly limited. Any of a Ba compound, a Ca compound, a Ti compound, a Sn compound, and a Zr compound can achieve the same effect.

Granulated Powder and Compact

In the case where a piezoelectric material used in a piezoelectric element according to an embodiment of the present invention is formed into a ceramic (sintered body), it is necessary to prepare a compact used for firing. The compact is a solid body prepared by molding a raw material powder.

Examples of the molding method include uniaxial pressing, cold hydrostatic pressing, warm hydrostatic pressing, cast molding, and extrusion molding. In preparation of a compact, a granulated powder is preferably used. The use of a granulated powder is advantageous in that when a compact prepared by using a granulated powder is sintered, the distribution of the size of crystal grains of the sintered body becomes easily uniform.

The method for granulating raw material powders of the piezoelectric material is not particularly limited. From the viewpoint that the grain size of the resulting granulated powder can be made more uniform, a spray dry method is most preferably used as a granulation method.

Examples of a binder that can be used in granulation include polyvinyl alcohol (PVA), polyvinyl butyral (PVB), and acrylic resins. The amount of binder added is preferably 1 to 10 parts by weight relative to raw material powders of the piezoelectric material. The amount of binder added is more preferably 2 to 5 parts by weight from the viewpoint of increasing the density of a compact.

Sintering

A method for producing a ceramic piezoelectric material by sintering the compact is not particularly limited. In order to allow elemental Sn to be stably present in the A-sites of the perovskite structure, sintering is preferably performed in a reducing atmosphere (low-oxygen atmosphere). For example, for the purpose of removing an organic component such as a binder in advance, heat treatment is performed at 500° C. or lower in an air atmosphere or an oxygen-excess atmosphere. Next, as a main firing process for accelerating crystallization, heat treatment is performed in the range of about 1,100° C. to 1,400° C. in a reducing atmosphere to obtain a sintered body (ceramic). The time of the heat treatment of the main firing process may be 3 hours or more. In this case, the grain growth of crystals is accelerated. The time of the heat treatment of the main firing process is preferably 24 hours or less because the amount of oxygen deficiency does not become excessive. The reducing atmosphere is preferably an atmosphere in which the oxygen partial pressure is controlled to $1.0 \times 10^{-10}$ MPa or less in order to maintain the valence of elemental Sn to 2. The oxygen concentration can be measured with a zirconia-type oxygen concentration meter. In order to form the reducing atmosphere, a hydrogen ($H_2$)-containing gas, a water vapor ($H_2O$)-containing gas, or an argon (Ar)-containing gas is preferably used. Among these, from the viewpoint of a reducing property, specific heat, and thermal conductivity, a hydrogen-containing gas is most preferably used. A hydrogen-nitrogen mixed gas or a hydrogen-nitrogen-water vapor mixed gas may also be used. A ceramic sintered in a reducing atmosphere may have oxygen deficiency. When a ceramic used in a piezoelectric element has oxygen deficiency, piezoelectric properties may significantly decrease. Therefore, in order to decrease (compensate) oxygen deficiency, post-heating (post-annealing) may be performed on the ceramic in an atmosphere having an oxygen partial pressure higher than that in the main firing. In order to prevent the valence of Sn from changing, the maximum temperature in the post-heating is preferably lower than 1,100° C. The heat treatment time of the post heating is preferably 1 hour or more because the effect of decreasing oxygen deficiency can be significantly obtained. The above heat treatment time is preferably 12 hours or less because the change in the valence of Sn can be suppressed.

Polishing

The sintered body can be used as a piezoelectric material according to an embodiment of the present invention without further treatment. However, the sintered body may be polished so as to have a desired shape. The sintered body after polishing is preferably subjected to heat treatment at 150° C. or higher and 500° C. or lower for about 1 hour to 4 hours. The atmosphere in this heat treatment is not particularly limited. A residual stress is generated inside the piezoelectric material (sintered body) that has been mechanically polished. However, the residual stress is released by the heat treatment, and thus piezoelectric properties of the piezoelectric material are further improved.

Thickness of Ceramic Piezoelectric Material

In the case where the piezoelectric material according to an embodiment of the present invention is produced as a ceramic (sintered body), when the distance between two surfaces that are smoothed by the polishing is defined as a thickness of the piezoelectric material, the thickness is preferably 100 µm or more and 10 mm or less, and more preferably 200 µm or more and 5 mm or less. When the thickness is 100 µm or less, an adverse effect of a defective portion of the ceramic on the piezoelectric properties, the defective portion being due to the processing, may be increased. When the thickness is 10 mm or more, the effect of improving piezoelectric properties may be insufficient in the case where the piezoelectric material according to an embodiment of the present invention is used in an element and a polarization treatment of the element is performed.

Film-Shaped Piezoelectric Material

When the piezoelectric material according to an embodiment of the present invention is used as a film formed on a substrate, the thickness of the piezoelectric material is preferably 200 nm or more and 10 µm or less, and more preferably 300 nm or more and 3 µm or less. When the film thickness of the piezoelectric material is 200 nm or more and 10 µm or less, a sufficient electromechanical conversion function of a piezoelectric element is obtained.

A method for forming the film-shaped piezoelectric material is not particularly limited. Examples of the method include a chemical solution deposition (CSD) method, a sol-gel method, a metal organic chemical vapor deposition (MOCVD) method, a sputtering method, a pulse laser deposition (PLD) method, a hydrothermal synthesis method, and an aerosol deposition (AD) method. Among these methods, the chemical solution deposition (CSD) method or the sputtering method is most preferable. In the chemical solution deposition (CSD) method or the sputtering method, a large film formation area can be easily ensured, and elemental Sn can be easily and stably allowed to be present in the A-sites of the perovskite structure by accelerating crystallization in a reducing atmosphere (low-oxygen atmosphere).

The substrate used with the piezoelectric material according to an embodiment of the present invention is preferably a single-crystal substrate prepared by cutting and polishing along a (001) plane or a (110) plane. By using a single-crystal substrate prepared by cutting and polishing along a particular crystal plane, a piezoelectric material film provided on the surface of the substrate can also be strongly oriented in the same direction.

Piezoelectric Element

FIG. 1A is a schematic view showing a structure of a piezoelectric element according to an embodiment of the present invention. The piezoelectric element includes at least a first electrode 1, a piezoelectric material portion 2, and a second electrode 3, in which the piezoelectric material portion 2 is composed of the piezoelectric material according to an embodiment of the present invention. Another electrode may be provided on a surface of the piezoelectric material portion 2. The piezoelectric material portion 2 is preferably formed of a piece of a piezoelectric material. The term "a piece of a piezoelectric material" refers to a seamless ceramic piezoelectric material produced by simultaneously firing raw materials having a certain composition. The arrow drawn in the piezoelectric material portion 2 schematically indicates a direction of remanent polarization of a piezoelectric material.

The piezoelectric material portion 2 has an area sandwiched between the first electrode 1 and the second electrode 3, and the area includes a region having remanent polarization. The region having remanent polarization may be a part or the whole of the area of the piezoelectric material portion 2, the area being sandwiched between the first electrode 1 and the second electrode 3. From the viewpoint of improving piezoelectric properties, the whole of the area sandwiched between the first electrode 1 and the second electrode 3 is preferable. The term "remanent polarization" refers to polarization remaining in the piezoelectric material portion 2 when an external electric field is not applied to the piezoelectric material portion 2. When the piezoelectric material portion 2 is subjected to a polarization treatment, the direction of spontaneous polarization is aligned in a certain direction in the piezoelectric material portion 2 and remanent polarization is produced. Whether or not the piezoelectric material portion 2 has remanent polarization can be determined by applying an electric field between the first electrode 1 and the second electrode 3 of the piezoelectric element, and measuring a relationship (P-E hysteresis curve) between the applied electric field E and the amount of polarization P. When the piezoelectric material in the piezoelectric element according to an embodiment of the present invention has remanent polarization in a certain direction, the direction of a dipole moment of polarization relating to piezoelectric driving is aligned, thereby increasing the piezoelectric constant of the piezoelectric element.

Figure 1B:
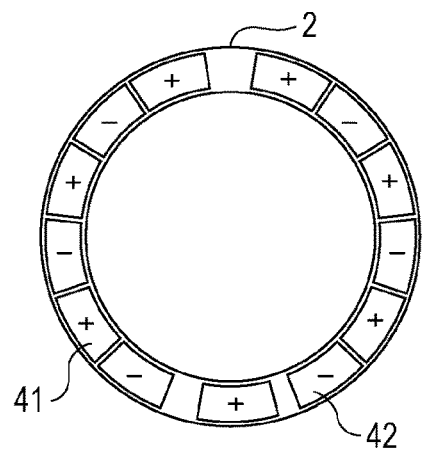
Figure 1C:
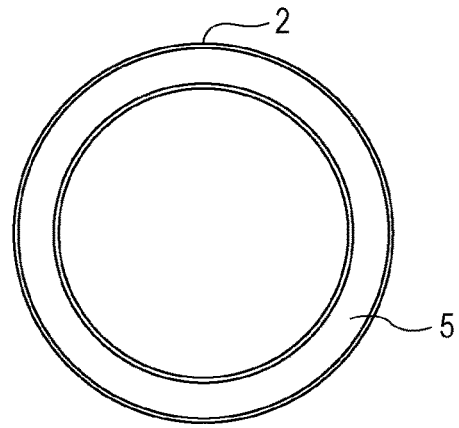

FIGS. 1B and 1C are schematic views showing a piezoelectric element according to another embodiment of the present invention. FIG. 1B is a schematic view showing the shape of electrodes and the polarity of remanent polarization when the piezoelectric element is viewed from one of the surfaces thereof. FIG. 1C is a schematic view showing the shape of an electrode when the piezoelectric element is viewed from the other surface. In FIGS. 1B and 1C, the piezoelectric element includes a piece of annular piezoelectric material 2, a plurality of electrodes 41 and 42 (including electrodes that are not assigned with reference numerals) arranged on one surface of the piezoelectric material 2, and a common electrode 5 arranged on another surface of the piezoelectric material 2. The signs of "+" and "−" shown inside the electrodes 41 and 42, etc. in FIG. 1B denote the polarity of remanent polarization of a piezoelectric material in a region that is sandwiched between each electrode on the one surface and the common electrode on the other surface. Herein, the sign of "+" is shown in an electrode portion to which a positive electric field is applied in a polarization treatment in a process for producing the piezoelectric element. Accordingly, a negative value is detected when a piezoelectric constant $d_{33}$ is measured only in the electrode portions marked with "+". Similarly, a positive piezoelectric constant $d_{33}$ is detected in the electrode portions marked with "−". In FIG. 1B, in a region where an electrode is not provided or a region (not shown) of the piezoelectric material sandwiched between an electrode that does not have remanent polarization and the common electrode 5 on the other surface, a piezoelectric constant $d_{33}$ of zero or a very small value, for example, 5 pC/N or less, is detected. The piezoelectric element shown in FIG. 1B includes the piezoelectric material 2 including a first region having remanent polarization in a downward direction with respect to the surface of the drawing and a second region having remanent polarization in an upward direction. Examples of a method for confirming that the polarity of remanent polarization in the first region is different from that in the second region include a method of determining on the basis of the plus and minus of the values detected by the measurement of the piezoelectric constant and a method of determining that the directions of shift from an origin of the coercive electric field in a P-E hysteresis curve are opposite to each other.

The piezoelectric element according to an embodiment of the present invention including the first region and the second region that have remanent polarizations whose polarities are different from each other as shown in FIGS. 1B and 1C can form oscillatory waves in the circular direction. This is because when an electric field is applied to the first region and the second region at the same time, one of the regions is extended and the other of the regions is contracted in the circular direction by the piezoelectric effect.

Electrodes

The piezoelectric element according to an embodiment of the present invention includes the first electrode 1 and the second electrode 3 shown in FIG. 1A or the plurality of electrodes 41 and 42 and the common electrode 5 shown in FIGS. 1B and 1C. Thus, piezoelectric driving in which electrical energy is changed to mechanical energy can be performed.

The electrodes are each formed of a conductive layer having a thickness of about 5 nm to 10 μm. The material of the electrodes is not particularly limited, and a material that is commonly used in a piezoelectric element may be used. Examples thereof include metals such as Ti, Pt, Ta, Ir, Sr, In, Sn, Au, Al, Fe, Cr, Ni, Pd, Ag, and Cu and compounds thereof.

Each of the electrodes may be composed of one of the above materials. Alternatively, the electrode may be formed by stacking two or more layers composed of any of the materials. The respective electrodes arranged in the piezoelectric element may be composed of different materials.

A method for producing the electrodes is not limited. The electrodes may be formed by baking a metal paste such as a silver paste. Alternatively, the electrodes may be formed by a sputtering method, a vapor deposition method, or the like. The form of the electrodes is not limited to the example shown in FIG. 1B. If necessary, each of the electrodes may be formed by patterning so as to have a desired shape and used.

Polarization Treatment

A polarization method for providing remanent polarization to the piezoelectric element according to an embodiment of the present invention is not particularly limited. The polarization treatment may be performed in the air or in silicone oil. The temperature during the polarization treatment is preferably 60° C. to 150° C. However, the optimum conditions are somewhat different depending on the composition of the piezoelectric material that forms an element. The electric field applied for conducting the polarization treatment is preferably 0.5 to 7.0 kV/mm and more preferably 1.0 to 3.0 kV/mm.

Depolarization Temperature

In order that the piezoelectric element according to an embodiment of the present invention does not lose piezoelectric properties even in a high-temperature atmosphere and in order to prevent piezoelectric properties from decreasing by a heating process in a step of assembling a device or heat generated during driving of a device, it is preferable to select a composition of the piezoelectric material having a depolarization temperature of 100° C. or higher, preferably 105° C. or higher, and more preferably 110° C. or higher. The depolarization temperature of the piezoelectric device can be controlled by the composition parameters α, x, y, and z, the Mn content, crystallinity of the piezoelectric material, or the compositional uniformity on a micro-scale.

Measurement of Piezoelectric Constant and Mechanical Quality Factor

The piezoelectric constant and the mechanical quality factor of the piezoelectric element can be determined by a calculation from the results of a resonance frequency and an antiresonance frequency measured with a commercially available impedance analyzer in accordance with Japan Electronics and Information Technology Industries Association Standard (JEITA EM-4501). This method is hereinafter referred to as a "resonance-antiresonance method".

Structure of Multilayered Piezoelectric Element

A multilayered piezoelectric element according to an embodiment of the present invention will be described.

A multilayered piezoelectric element according to an embodiment of the present invention includes a plurality of piezoelectric material layers and a plurality of electrode layers including an internal electrode, the piezoelectric material layers and the electrode layers being alternately stacked. In the multilayered piezoelectric element, the piezoelectric material layers are composed of the piezoelectric material according to an embodiment of the present invention, the piezoelectric material layers each have a region sandwiched between the electrode layers, and a part or the whole of the region has remanent polarization.

Figure 2A:
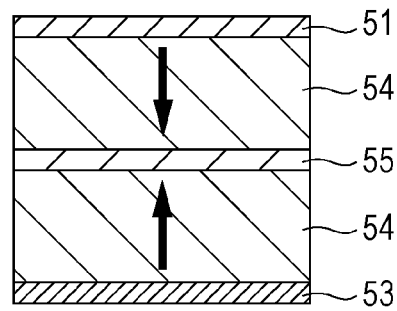
FIGS. 2A and 2B are each a schematic cross-sectional view showing a structure of a multilayered piezoelectric element according to an embodiment of the present invention.

FIG. 2A is a schematic cross-sectional view showing a structure of a multilayered piezoelectric element according to an embodiment of the present invention. The multilayered piezoelectric element includes piezoelectric material layers 54 and electrodes including an internal electrode 55, the piezoelectric material layers and the electrodes being alternately stacked, in which the piezoelectric material layers 54 are composed of the piezoelectric material described above. The electrodes may include external electrodes such as a first electrode 51 and a second electrode 53 besides the internal electrode 55. In each of the piezoelectric material layers 54, a part or the whole of a region sandwiched between the electrodes has remanent polarization. The arrows shown in the piezoelectric material layers 54 schematically show the directions of remanent polarization of the piezoelectric material layers 54. Whether or not a piezoelectric material layer 54 has remanent polarization can be determined by applying an electric field between electrodes that sandwich the piezoelectric material layer 54, and measuring the relationship (P-E hysteresis curve) between the applied electric field E and the amount of polarization P. When a part or the whole of the region of the piezoelectric material layer 54 in the multilayered piezoelectric element according to an embodiment of the present invention has remanent polarization in a certain direction (one of the two directions perpendicular to the electrodes), the direction of polarization moment relating to piezoelectric driving is aligned, and thus the piezoelectric strain of the multilayered piezoelectric element increases.

Figure 2B:
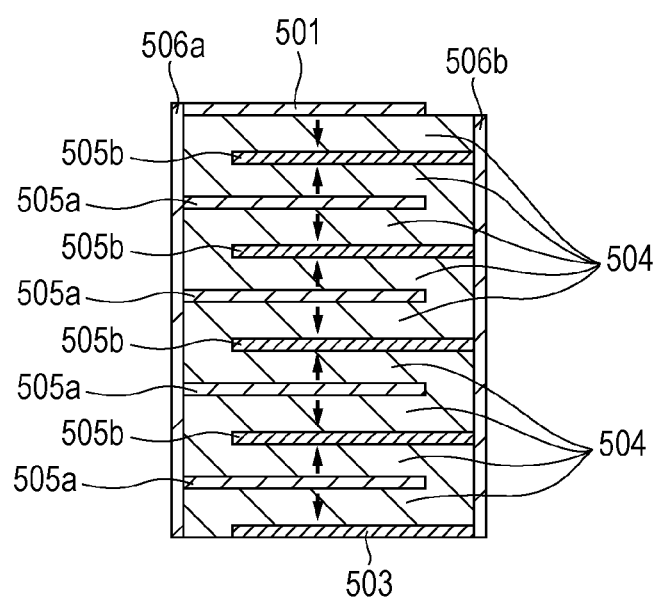

FIG. 2A shows a structure of a multilayered piezoelectric element according to an embodiment of the present invention in which two piezoelectric material layers 54 and one internal electrode 55 are alternately stacked and the resulting laminated structure is sandwiched between the first electrode 51 and the second electrode 53. Alternatively, as shown in FIG. 2B, the number of piezoelectric material layers and the number internal electrodes may be increased, and the numbers of layers are not particularly limited. A multilayered piezoelectric element shown in FIG. 2B has a structure in which nine piezoelectric material layers 504 and eight internal electrodes 505 are alternately stacked, and the resulting laminated structure is sandwiched between a first electrode 501 and a second electrode 503. The multilayered piezoelectric element further includes an external electrode 506a and an external electrode 506b for short-circuiting the internal electrodes that are alternately formed. The size and the shape of the internal electrodes 55 and 505 and the external electrodes 506a and 506b are not necessarily the same as those of the piezoelectric material layers 54 and 504. The internal electrodes 55 and 505 and the external electrodes 506a and 506b may be divided into a plurality of portions. In each of the piezoelectric material layers 54 and 504, a part or the whole of the region sandwiched between the electrodes has remanent polarization.

Among the plurality of piezoelectric material layers, any piezoelectric material layer and an adjacent piezoelectric material layer may have opposite directions of remanent polarization with respect to a direction in which the piezoelectric material layers are stacked. That is, the regions having remanent polarization in the piezoelectric material layers may have directions of remanent polarization, the directions being alternate with respect to the direction in which the piezoelectric material layers are stacked. In the case where the directions of remanent polarization are alternate with respect to the direction in which the piezoelectric material layers are stacked, the expansion/contraction mode of the piezoelectric material layers is aligned when the multilayered piezoelectric element according to an embodiment of the present invention is driven. As a result, a large piezoelectric displacement can be obtained. For example, in FIG. 2A, in the piezoelectric material layer 54, a region sandwiched between the first electrode 51 and the internal electrode 55 and a region sandwiched between the second electrode 53 and the internal electrode 55 may have different directions of remanent polarization. In the process for producing the multilayered piezoelectric element, when the same plus electric field or the same minus electric field is applied to the first electrode 51 and the second electrode 53 while the internal electrode 55 has a potential of zero, the directions of remanent polarization of the piezoelectric material layers 54 become opposite to each other with the internal electrode 55 as a boundary (when an electrode surface horizontally extends, the piezoelectric material layers have remanent polarization in an upper direction and a lower direction). Similarly, with regard to the piezoelectric material layers 504 having the structure shown in FIG. 2B, the directions of remanent polarization of the piezoelectric material layers 504 may be alternate with respect to the direction in which the piezoelectric material layers 504 are stacked, with each of the internal electrode layers as a boundary, as schematically shown by the arrows in the drawing.

Each of the internal electrodes 55 and 505, the external electrodes 506a and 506b, the first electrodes 51 and 501, and the second electrodes 53 and 503 is formed of a conductive layer having a thickness of about 5 nm to 10 µm. The material of these electrodes is not particularly limited and any material that is usually used in piezoelectric elements can be used. Examples thereof include metals such as Ti, Pt, Ta, Ir, Sr, In, Sn, Au, Al, Fe, Cr, Ni, Pd, Ag, and Cu and compounds thereof. Each of the internal electrodes and the external electrodes may be composed of one of these materials or a mixture or an alloy of two or more of these materials. Each of the electrodes may be formed by stacking two or more layers composed of any of the materials. The plurality of electrodes may be composed of materials different from each other.

In the multilayered piezoelectric element according to an embodiment of the present invention, the internal electrodes 55 and 505 preferably contain Ag and Pd, and preferably has a weight ratio M1/M2 of a weight content M1 of Ag to a weight content M2 of Pd satisfying a relationship $0.25 \leq M1/M2 \leq 4.0$ and more preferably $0.3 \leq M1/M2 \leq 3.0$. When the weight ratio M1/M2 is less than 0.25, the sintering temperature of the internal electrodes becomes high. When the weight ratio M1/M2 exceeds 4.0, the internal electrodes are formed in the form of islands and become uneven in the plane.

In view of the low cost of the electrode material, the internal electrodes 55 and 505 may contain at least one of Ni and Cu. When the internal electrodes 55 and 505 contain at least one of Ni and Cu, the multilayered piezoelectric element according to an embodiment of the present invention may be fired in a reducing atmosphere.

As shown in FIG. 2B, the electrodes including the internal electrodes 505 may be short-circuited from each other so as to match the phase of the driving voltage. For example, the internal electrodes 505a and the first electrode 501 may be short-circuited through the external electrode 506a. The internal electrodes 505b and the second electrode 503 may be short-circuited through the external electrode 506b. The internal electrodes 505a and the internal electrodes 505b may be alternately arranged. The form of short-circuiting between the electrodes is not particularly limited. Electrodes or conductive lines for short-circuiting may be provided on side surfaces of the multilayered piezoelectric element. Alternatively, a through-hole penetrating the piezoelectric material layers 504 may be provided and the inside thereof may be filled with a conductive material so as to short-circuit the electrodes.

Method for Producing Multilayered Piezoelectric Element

An example of a method for producing a multilayered piezoelectric element according to an embodiment of the present invention will now be described, but the method is not particularly limited thereto. A description will be made of a method including a step (A) of preparing a slurry by dispersing a metal compound powder containing at least Ba, Ca, Sn, Ti, and Zr, a step (B) of preparing a formed body by disposing the slurry on a base, a step (C) of forming an electrode on the formed body, and a step (D) of obtaining a multilayered piezoelectric element by sintering the formed body on which the electrode is formed.

Herein, the term "powder" is intended to mean an aggregate of solid particles. The powder may be an aggregate of particles containing Ba, Ca, Sn, Ti, and Zr or may be an aggregate of different types of particles containing any element.

Examples of the metal compound powder used in the step (A) include Ba compounds, Ca compounds, Ti compounds, and Zr compounds. Any compound, for example, a Mn compound or a Mg compound may be added as required.

The compounds of the respective metals may be the same as those described as the raw materials of the piezoelectric material according to an embodiment of the present invention.

An example of the method for preparing a slurry in the step (A) will be described. The metal compound powder is mixed with a solvent in an amount of 1.6 to 1.7 times the weight of the metal compound powder. The solvent may be, for example, toluene, ethanol, a mixed solvent of toluene and ethanol, n-butyl acetate, or water. The metal compound powder and the solvent are mixed by using a ball mill for 24 hours, and a binder and a plasticizer are then added thereto. Examples of the binder include polyvinyl alcohol (PVA), polyvinyl butyral (PVB), and acrylic resins. In the case where PVB is used as the binder, the PVB is weighed such that the weight ratio of the solvent to the PVB is, for example, 88:12. Examples of the plasticizer include dioctyl sebacate, dioctyl phthalate, and dibutyl phthalate. In the case where dibutyl phthalate is used as the plasticizer, dibutyl phthalate is weighed in an amount that is the same as that of the binder. The mixing is performed again using a ball mill overnight. The amounts of solvent and binder are controlled such that the slurry has a viscosity of 300 to 500 mPa·s.

The formed body in the step (B) is a sheet-like mixture of the metal compound powder, the binder, and the plasticizer. An example of a method for preparing the formed body in the step (B) is sheet forming. The sheet forming may be performed by, for example, a doctor blade method. The doctor blade method is a method for forming a sheet-like formed body by applying the slurry onto the base with a doctor blade and drying the slurry. For example, a polyethylene terephthalate (PET) film may be used as the base. A surface of the PET film, the surface having the slurry thereon, may be coated with fluorine in advance because the resulting formed body can be easily detached from the PET film. The drying may be natural drying or hot air drying. The thickness of the formed body is not particularly limited and can be controlled depending on the thickness of the multilayered piezoelectric element. The thickness of the formed body can be increased by, for example, increasing the viscosity of the slurry.

The method for forming electrodes, i.e., the internal electrodes 505 and the external electrodes 506a and 506b, in the step (C) is not particularly limited. The electrodes may be formed by, for example, baking a metal paste or by a sputtering method, a vapor deposition method, a printing method, or the like. In order to reduce the driving voltage, the thickness and the pitch distance of the piezoelectric material layers 504 may be decreased. In such a case, a laminate including a precursor of the piezoelectric material layers 504 and the internal electrodes 505a and 505b is formed, and the laminate is then fired at one time. In such a case, it is desirable to use a material of the internal electrodes in which a change in the shape and a decrease in conductivity do not occur at a temperature necessary for sintering the piezoelectric material layers 504. In addition, a reduction-resistant material whose conductivity does not significantly decrease in a reducing atmosphere may be used as the electrodes. A metal such as Ag, Pd, Au, Cu, or Ni, which has a low melting point and is inexpensive as compared with Pt, or an alloy thereof may be used as the internal electrodes 505a and 505b and the external electrodes 506a and 506b. The external electrodes 506a and 506b may be provided after firing of the laminate. In such a case, Al or a carbon-based electrode material may be used in addition to Ag, Pd, Cu, and Ni.

The method for forming the electrodes may be a screen printing method. In the screen printing method, a screen printing plate is placed on a formed body disposed on a base, and a metal paste is applied onto the formed body through the screen printing plate with a spatula. The screen printing plate includes a screen mesh in at least a part thereof. Accordingly, the metal paste is applied onto the formed body through the part where the screen mesh is formed. A pattern may be formed in the screen mesh of the screen printing plate. By transferring the pattern to the formed body by using the metal paste, an electrode can be formed so as to have a pattern on the formed body.

After the formation of the electrodes in the step (C), the formed body is separated from the base. Subsequently, one or a plurality of the formed bodies are stacked and pressure-bonded to each other. Examples of the pressure-bonding method include uniaxial pressing, cold hydrostatic pressing, and warm hydrostatic pressing. The warm hydrostatic pressing is preferable because a pressure can be isotropically and uniformly applied. During the pressure-bonding, heating may be performed to around the glass transition temperature of the binder. In this case, pressure bonding can be more satisfactorily performed. A plurality of the formed bodies may be stacked so as to have a desired thickness, and then pressure-bonded. For example, the formed bodies can be laminated by stacking 10 to 100 formed bodies, and then conducting thermocompression bonding at 50° C. to 80° C. for 10 seconds to 10 minutes while applying a pressure of 10 to 60 MPa in a direction in which the formed bodies are stacked. A plurality of formed bodies can be laminated with high accuracy by providing alignment marks to the electrodes and adjusting the alignment of the formed bodies using the marks. Alternatively, the formed bodies can also be laminated with high accuracy by providing the formed bodies with through-holes for positioning.

The sintering temperature of the formed bodies in the step (D) is not particularly limited. The sintering temperature may be a temperature at which compounds react with each other and crystals sufficiently grow. From the viewpoint that the grain size of the ceramic is controlled to 0.3 to 10 μm, the sintering temperature is preferably 1,100° C. or higher and 1,500° C. or lower, and more preferably 1,150° C. or higher and 1,300° C. or lower. A multilayered piezoelectric element sintered in the above temperature range exhibits a good piezoelectric performance. The step (D) may be conducted in a furnace in which atmosphere firing can be performed. The binder is removed by being burnt away in an air atmosphere at a temperature of 200° C. to 500° C. The atmosphere is then changed to a reducing atmosphere, and sintering is performed at 1,100° C. to 1,500° C. and more preferably at 1,150° C. to 1,300° C. The reducing atmosphere may be an atmosphere in which the oxygen partial pressure is controlled to $1.0 \times 10^{-10}$ MPa or less in order to maintain the valence of elemental Sn to 2. The oxygen concentration can be measured with a zirconia-type oxygen concentration meter. In order to form the reducing atmosphere, a hydrogen ($H_2$)-containing gas, a water vapor ($H_2O$)-containing gas, or an argon (Ar)-containing gas is preferably used. Among these, from the viewpoint of a reducing property, specific heat, and thermal conductivity, a hydrogen-containing gas is most preferably used. A hydrogen-nitrogen mixed gas or a hydrogen-nitrogen-water vapor mixed gas may also be used. The piezoelectric material layers 504 of the multilayered piezoelectric element sintered in the reducing atmosphere may have oxygen deficiency. When the piezoelectric material layers 504 have oxygen deficiency, piezoelectric properties may significantly decrease. Therefore, in order to decrease (compensate) oxygen deficiency, post-heating (post-annealing) may be performed on the multilayered piezoelectric element in an atmosphere having an oxygen partial pressure higher than that in the main firing. In order to prevent the valence of Sn from changing, the maximum temperature in the post-heating is preferably lower than 1,100° C. The heat treatment time of the post heating is preferably 1 hour or more because the effect of decreasing oxygen deficiency can be significantly obtained. The heat treatment time is preferably 12 hours or less because the change in the valence of Sn can be suppressed. After the formed bodies are taken out from the sintering furnace, a conductive paste is applied onto side surfaces of the laminated product to which edge portions of the internal electrodes are exposed, and the paste is dried. Thus, the outer electrodes can be formed. The polarization treatment is performed using the external electrodes as in the piezoelectric element according to an embodiment of the present invention.

Liquid Ejection Head

A liquid ejection head according to an embodiment of the present invention includes at least a liquid chamber including a vibration unit that includes the piezoelectric element or the multilayered piezoelectric element described above, and an ejection port in communication with the liquid chamber.

Figure 3A:
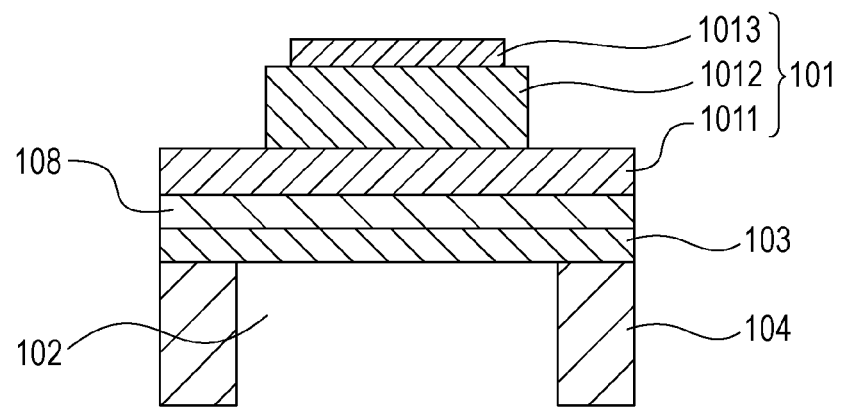
FIGS. 3A and 3B are each a schematic view showing a structure of a liquid ejection head according to an embodiment of the present invention.
Figure 3B:
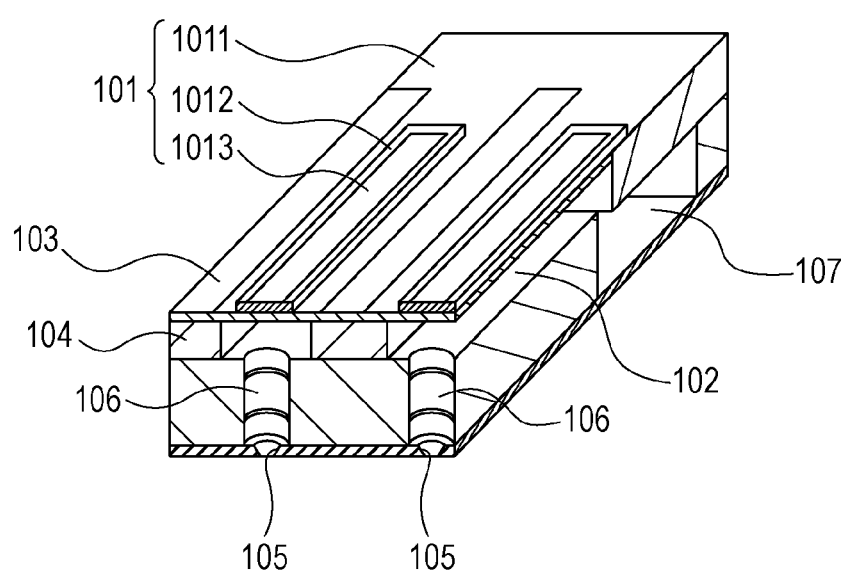

FIGS. 3A and 3B are each a schematic view showing a structure of a liquid ejection head according to an embodiment of the present invention. As shown in FIGS. 3A and 3B, the liquid ejection head includes a piezoelectric element 101 according to an embodiment of the present invention. The piezoelectric element 101 includes at least a first electrode 1011, a piezoelectric material 1012, and a second electrode 1013. As shown in FIG. 3B, the piezoelectric material 1012 is patterned as required.

FIG. 3B is a schematic view of the liquid ejection head. The liquid ejection head includes ejection ports 105, individual liquid chambers 102, communicating holes 106 that connect the individual liquid chambers 102 to the ejection ports 105, liquid chamber partitions 104, a common liquid chamber 107, a diaphragm 103, and the piezoelectric element 101. The piezoelectric element 101 has a rectangular shape in the drawing. Alternatively, the piezoelectric element 101 may have any shape other than a rectangular shape, such as an elliptical shape, a circular shape, or a parallelogram shape. In general, the piezoelectric material 1012 has a shape conforming to the shape of the individual liquid chamber 102.

A nearby portion of the piezoelectric element 101 included in the liquid ejection head according to an embodiment of the present invention will now be described in detail with reference to FIG. 3A. FIG. 3A is a cross-sectional view of the piezoelectric element shown in FIG. 3B taken in the width direction. The cross-sectional shape of the piezoelectric element 101 is a rectangle in the drawing. Alternatively, the cross-sectional shape may be a trapezoidal shape, an inverted trapezoidal shape, or the like.

In the drawing, the first electrode 1011 is used as a lower electrode and the second electrode 1013 is used as an upper electrode. However, the arrangement of the first electrode 1011 and the second electrode 1013 is not limited thereto. For example, the first electrode 1011 may be used as the lower electrode or the upper electrode. Similarly, the second electrode 1013 may be used as the upper electrode or the lower electrode. A buffer layer 108 may be provided between the diaphragm 103 and the lower electrode. Note that these differences in the names are derived from the method for producing a device, and advantages of the present invention can be achieved in either case.

In the liquid ejection head, the diaphragm 103 oscillates in vertical directions due to expansion and contraction of the piezoelectric material 1012 and applies pressure to a liquid in the individual liquid chambers 102. As a result, the liquid is ejected from the ejection ports 105. The liquid ejection head according to an embodiment of the present invention can be used in printers and in the production of electronic devices.

The thickness of the diaphragm 103 is 1.0 μm or more and 15 μm or less and preferably 1.5 μm or more and 8 μm or less. The material of the diaphragm 103 is not particularly limited but may be silicon (Si). Silicon constituting the diaphragm 103 may be doped with boron or phosphorus. The buffer layer 108 on the diaphragm 103 and an electrode on the buffer layer 108 may constitute a part of the diaphragm 103. The thickness of the buffer layer 108 is 5 nm or more and 300 nm or less and preferably 10 nm or more and 200 nm or less. The size of each of the ejection ports 105 is 5 μm or more and 40 μm or less in terms of equivalent circle diameter. The shape of the ejection port 105 may be a circle, a star shape, a rectangle, a triangle, or the like.

Liquid Ejection Apparatus

A liquid ejection apparatus according to an embodiment of the present invention will now be described. A liquid ejection apparatus according to an embodiment of the present invention includes a stage configured to receive an object and the liquid ejection head described above.

Figure 4:
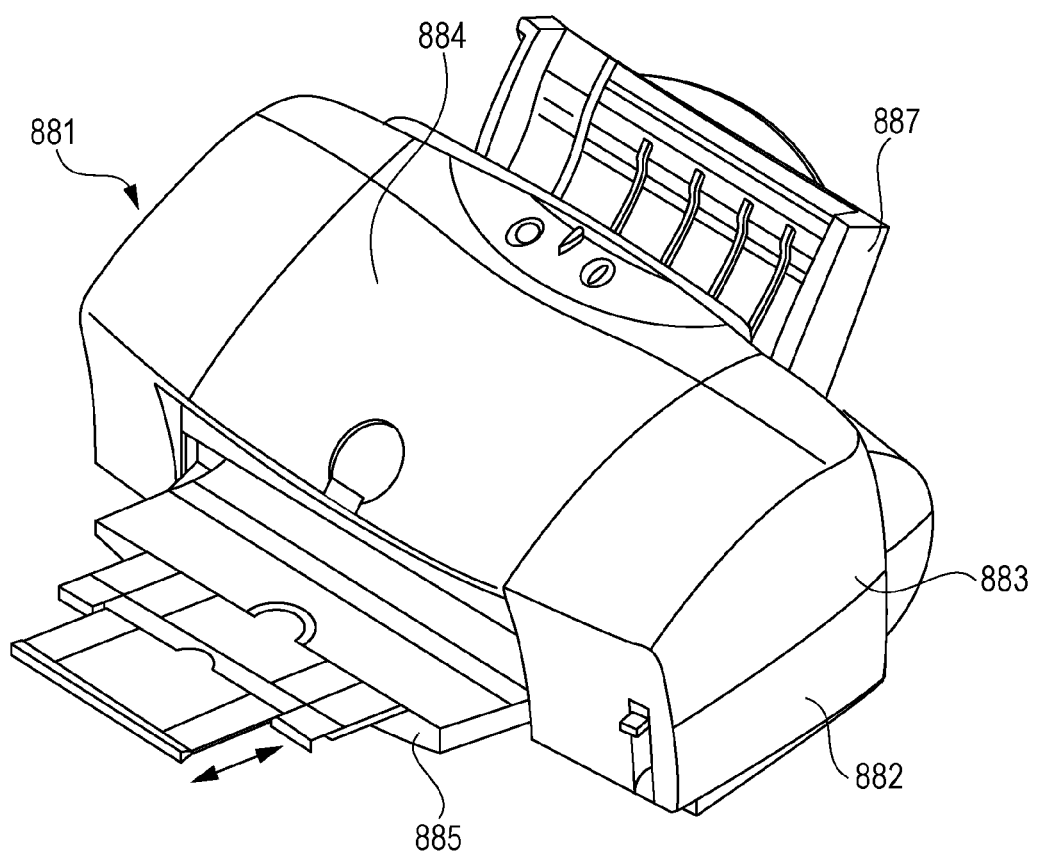
FIG. 4 is a schematic view showing a liquid ejection apparatus according to an embodiment of the present invention.
Figure 5:
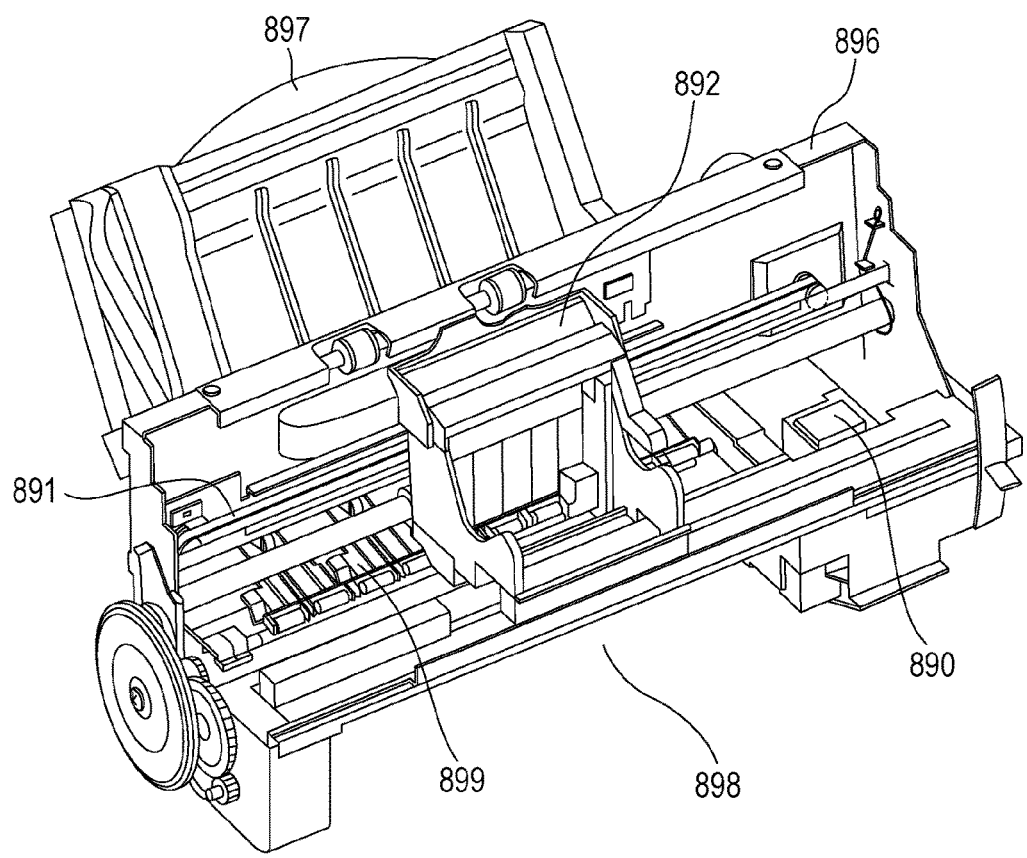
FIG. 5 is a schematic view showing a liquid ejection apparatus according to an embodiment of the present invention.

An example of the liquid ejection apparatus according to an embodiment of the present invention is an ink jet recording apparatus shown in FIGS. 4 and 5. FIG. 5 shows the state in which outer casings 882 to 885 and 887 are detached from a liquid ejection apparatus (ink jet recording apparatus) 881 shown in FIG. 4. The ink jet recording apparatus 881 includes an automatic supply unit 897 that automatically supplies a recording sheet serving as an object into a main body 896 of the apparatus. The ink jet recording apparatus 881 further includes a transport unit 899 that is a stage configured to receive the object and that guides the recording sheet supplied from the automatic supply unit 897 to a predetermined recording position and from the recording position to an ejection slot 898, a recording unit 891 that conducts recording on the recording sheet transported to the recording position, and a recovery unit 890 that conducts a recovery process on the recording unit 891. The recording unit 891 has a carriage 892 that houses the liquid ejection head according to an embodiment of the present invention and that moves on a rail in a reciprocating manner.

In this ink jet recording apparatus, when the carriage 892 is moved on the rail by electrical signals transmitted from a computer and a driving voltage is applied to the electrodes sandwiching the piezoelectric material, the piezoelectric material is deformed. This deformation of the piezoelectric material pressurizes the individual liquid chamber 102 through the diaphragm 103 shown in FIG. 3B, and causes ink to be ejected from the ejection port 105, thus conducting printing.

The liquid ejection apparatus according to an embodiment of the present invention can eject a liquid uniformly at a high speed. In addition, the size of the liquid ejection apparatus can be reduced.

An example of a printer has been described above. However, the liquid ejection apparatus according to an embodiment of the present invention can be used as industrial liquid ejection apparatuses besides ink jet recording apparatuses such as facsimile machines, multifunction apparatuses, and copy machines.

In addition, the user can select a desired object in accordance with the use. The liquid ejection apparatus may be configured so that the liquid ejection head is relatively moved with respect to an object placed on the stage.

Ultrasonic Motor

An ultrasonic motor according to an embodiment of the present invention will now be described. An ultrasonic motor according to an embodiment of the present invention includes at least a vibrating member that includes the piezoelectric element or the multilayered piezoelectric element described above, and a moving member that is in contact with the vibrating member.

Figure 6A:
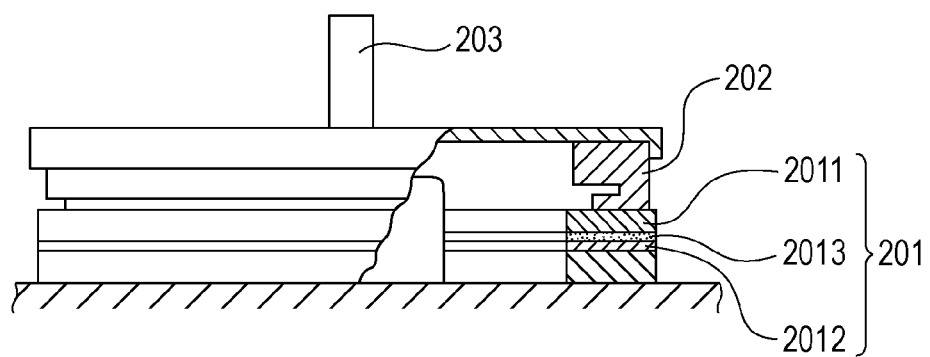
FIGS. 6A and 6B are each a schematic view showing a structure of an ultrasonic motor according to an embodiment of the present invention.
Figure 6B:
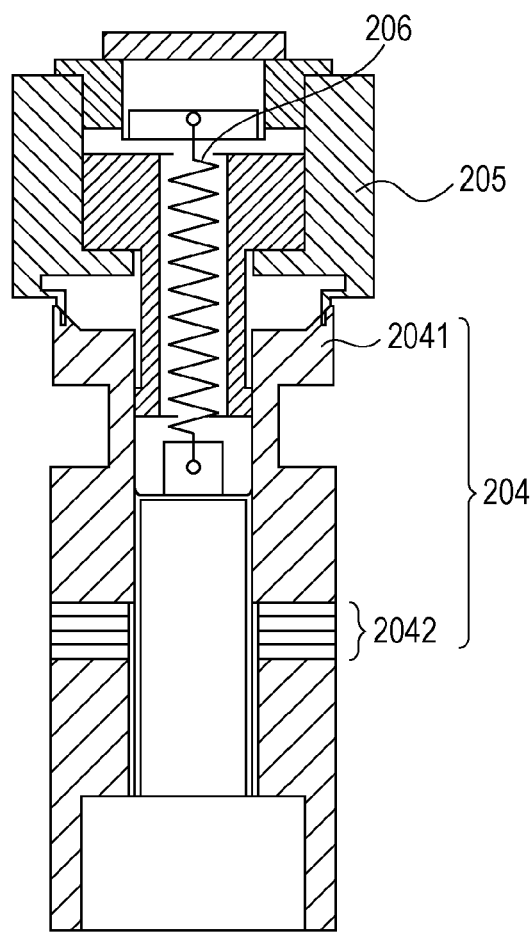

FIGS. 6A and 6B are each a schematic view showing a structure of an ultrasonic motor according to an embodiment of the present invention. FIG. 6A shows an ultrasonic motor that includes a piezoelectric element according to an embodiment of the present invention, the piezoelectric element having a single-layer structure. The ultrasonic motor includes an oscillator 201, a rotor 202 that is in contact with a sliding surface of the oscillator 201 with a pressing force from a pressing spring (not shown), and an output shaft 203 that is integrally provided with the rotor 202. The oscillator 201 includes a metal elastic ring 2011, a piezoelectric element 2012 according to an embodiment of the present invention, and an organic adhesive 2013 (such as an epoxy-based or cyanoacrylate-based adhesive) that bonds the piezoelectric element 2012 to the elastic ring 2011. The piezoelectric element 2012 includes a piezoelectric material sandwiched between a first electrode and a second electrode (not shown).

When an alternating voltage with two phases that are different by an odd multiple of $\pi/2$ is applied to the piezoelectric element according to an embodiment of the present invention, a flexural progressive wave is generated in the oscillator 201 and each point on the sliding surface of the oscillator 201 moves elliptically. When the rotor 202 is in contact with the sliding surface of the oscillator 201 under pressure, the rotor 202 receives a frictional force from the oscillator 201 and rotates in a direction opposite to that of the flexural progressive wave. An object to be driven (not shown) is joined to the output shaft 203 and is driven by the rotation force of the rotor 202.

When a voltage is applied to the piezoelectric material, the piezoelectric material is expanded and contracted by the piezoelectric transverse effect. In the case where an elastic member such as a metal member is joined to the piezoelectric element, the elastic member is bent as a result of expansion and contraction of the piezoelectric material. The ultrasonic motor described in this embodiment is a type of an ultrasonic motor that utilizes this principle.

FIG. 6B shows an example of an ultrasonic motor including a piezoelectric element having a multilayered structure. An oscillator 204 includes a cylindrical metal elastic member 2041 and a multilayered piezoelectric element 2042 disposed in the metal elastic member 2041. The multilayered piezoelectric element 2042 is composed of a plurality of laminated piezoelectric materials (not shown). A first electrode and a second electrode are disposed on outer surfaces of the laminate and internal electrodes are disposed inside the laminate. The metal elastic member 2041 is fixed with a bolt to sandwich the multilayered piezoelectric element 2042, thus forming the oscillator 204.

When alternating voltages having different phases are applied to the multilayered piezoelectric element 2042, the oscillator 204 excites two oscillations orthogonal to each other. These two oscillations are combined to form a circular oscillation that drives a tip of the oscillator 204. An annular recessed groove is formed in the upper portion of the oscillator 204 to increase the displacement of the oscillation for driving.

A rotor 205 is in contact with the oscillator 204 under pressure with a pressing spring 206 and receives a frictional force for driving. The rotor 205 is rotatably supported by a bearing.

Optical Apparatus

An optical apparatus according to an embodiment of the present invention will now be described. An optical apparatus according to an embodiment of the present invention includes a driving unit including the ultrasonic motor described above.

Figure 7A:
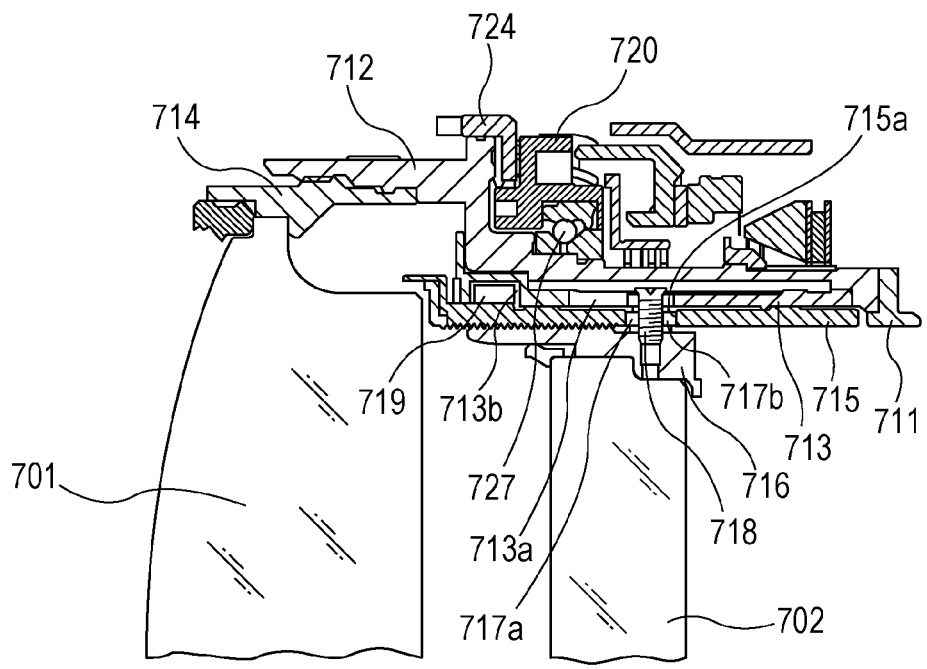
FIGS. 7A and 7B are each a schematic view showing an optical apparatus according to an embodiment of the present invention.
Figure 7B:
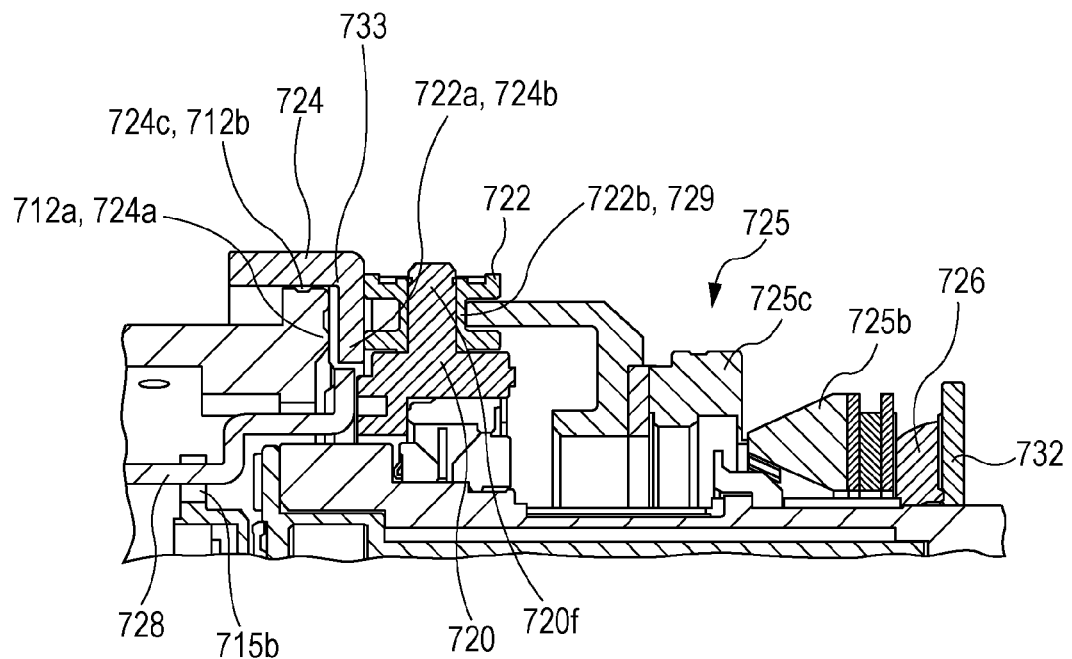

FIGS. 7A and 7B are each a cross-sectional view of a relevant part of a replaceable lens barrel of a single-lens reflex camera, which is an example of an optical apparatus according to an embodiment of the present invention. FIG. 8 is an exploded perspective view of the replaceable lens barrel of a single-lens reflex camera, which is an example of an optical apparatus according to an embodiment of the present invention. A fixed barrel 712, a linear guide barrel 713, and a front-group lens barrel 714 are fixed to a detachable mount 711 of the camera. These are fixed members of the replaceable lens barrel.

A linear guide groove 713a for a focus lens 702, the linear guide groove 713a extending in an optical axis direction, is formed in the linear guide barrel 713. Cam rollers 717a and 717b that protrude in an outer radial direction are fixed, with a shaft screw 718, to a rear-group lens barrel 716 holding the focus lens 702. The cam roller 717a is fitted in the linear guide groove 713a.

A cam ring 715 is rotatably fitted to the inner periphery of the linear guide barrel 713. A roller 719 fixed to the cam ring 715 is fitted in an annular groove 713b of the linear guide barrel 713. This structure regulates relative movements between the linear guide barrel 713 and the cam ring 715 in the optical axis direction. A cam groove 715a for the focus lens 702 is formed in the cam ring 715. The cam roller 717b is fitted in the cam groove 715a.

A rotation transmission ring 720 is disposed on the outer peripheral side of the fixed barrel 712. The rotation transmission ring 720 is held by a ball race 727 so as to rotate at a particular position with respect to the fixed barrel 712. A roller 722 is rotatably held by a shaft 720f extending in a radial manner from the rotation transmission ring 720. A large-diameter portion 722a of the roller 722 is in contact with a mount-side end surface 724b of a manual focus ring 724. A small-diameter portion 722b of the roller 722 is in contact with a joint member 729. Six rollers 722 are arranged on the outer periphery of the rotation transmission ring 720 at regular intervals, and each of the rollers 722 is configured to have the relationship described above.

A low-friction sheet (washer member) 733 is arranged on the inner circumferential portion of the manual focus ring 724. The low-friction sheet 733 is interposed between a mount-side end surface 712a of the fixed barrel 712 and a front-side end surface 724a of the manual focus ring 724. The outer circumferential surface of the low-friction sheet 733 has a ring shape and is fitted in an inner circumferential portion 724c of the manual focus ring 724. The inner circumferential portion 724c of the manual focus ring 724 is fitted in an outer circumferential portion 712b of the fixed barrel 712. The low-friction sheet 733 has a function of reducing the friction in a rotary ring mechanism in which the manual focus ring 724 rotates about the optical axis with respect to the fixed barrel 712.

The large-diameter portion 722a of the roller 722 is brought into contact with the mount-side end surface 724b of the manual focus ring 724 under pressure by a force generated by a wave washer 726 that presses an ultrasonic motor 725 toward the front side of the lens. Similarly, the small-diameter portion 722b of the roller 722 is brought into contact with the joint member 729 under an appropriate degree of pressure by a force generated by the wave washer 726 that presses the ultrasonic motor 725 toward the front side of the lens. The movement of the wave washer 726 in the mount direction is regulated by a washer 732 that is bayonet-mounted on the fixed barrel 712. A spring force (urging force) generated by the wave washer 726 is transmitted to the ultrasonic motor 725 and the roller 722 and also serves as a pressing force of the manual focus ring 724 against the mount-side end surface 712a of the fixed barrel 712. That is, the manual focus ring 724 is fitted while being pressed on the mount-side end surface 712a of the fixed barrel 712 with the low-friction sheet 733 therebetween.

Accordingly, when the ultrasonic motor 725 is rotated with respect to the fixed barrel 712 by a controlling unit (not shown), the roller 722 rotates about the center of the shaft 720f because the joint member 729 is in frictional contact with the small-diameter portion 722b of the roller 722. When the roller 722 rotates about the shaft 720f, the rotation transmission ring 720 consequently rotates about the optical axis (automatic focusing operation).

When a rotation force about the optical axis is applied from a manual operation input unit (not shown) to the manual focus ring 724, the roller 722 rotates about the shaft 720f by a frictional force because the mount-side end surface 724b of the manual focus ring 724 is in contact with the large-diameter portion 722a of the roller 722 under pressure. When the large-diameter portion 722a of the roller 722 rotates about the shaft 720f, the rotation transmission ring 720 rotates about the optical axis. The ultrasonic motor 725 is configured so that the ultrasonic motor 725 does not rotate at this time due to a frictional retention force of a rotor 725c and a stator 725b (manual focusing operation).

Two focus keys 728 are attached to the rotation transmission ring 720 at positions facing each other. The focus keys 728 are fitted in notches 715b provided at an end of the cam ring 715. Accordingly, when the automatic focusing operation or the manual focusing operation is performed and the rotation transmission ring 720 is rotated about the optical axis, the rotation force is transmitted to the cam ring 715 through the focus keys 728. When the cam ring 715 is rotated about the optical axis, the rear-group lens barrel 716, whose rotation is regulated by the cam roller 717a and the linear guide groove 713a, is moved back and forth along the cam groove 715a in the cam ring 715 by the cam roller 717b. Thus, the focus lens 702 is driven and a focusing operation is conducted.

A replaceable lens barrel of a single-lens reflex camera has been described as an example of the optical apparatus according to an embodiment of the present invention. However, the present invention is applicable to any type of camera such as a compact camera or an electronic still camera and any optical apparatus that includes an ultrasonic motor provided in a driving unit.

Vibration Apparatus and Dust Removing Device

Vibration apparatuses used for, for example, transporting or removing particles, powders, or liquids are widely used in electronic apparatuses etc. A dust removing device including a piezoelectric element according to an embodiment of the present invention will now be described as an example of a vibration apparatus according to an embodiment of the present invention.

A dust removing device according to an embodiment of the present invention includes at least a vibrating member that includes a diaphragm and the piezoelectric element or the multilayered piezoelectric element described above disposed on the diaphragm, and has a function of removing dust adhering to a surface of the diaphragm.

Figure 9A:
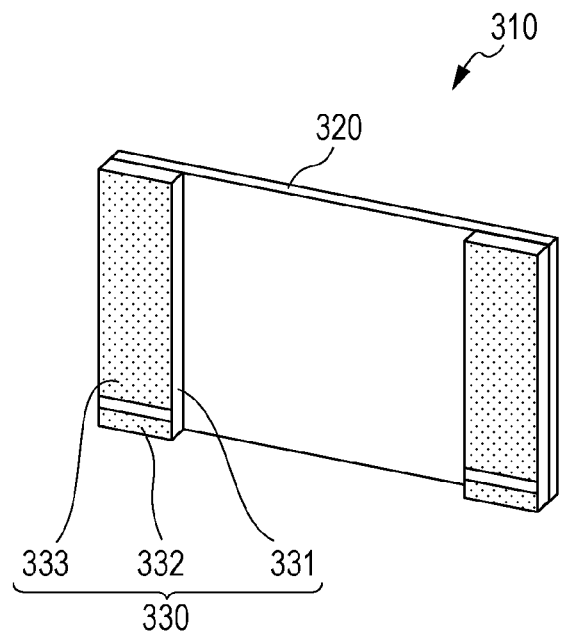
FIGS. 9A and 9B are each a schematic view showing a dust removing device according to an embodiment of the present invention.
Figure 9B:
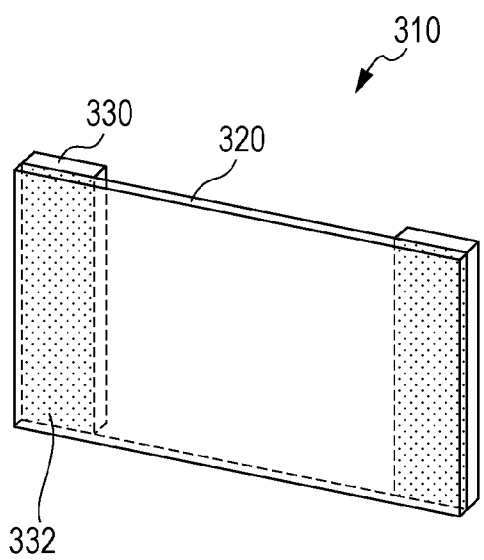

FIGS. 9A and 9B are each a schematic view showing a dust removing device according to an embodiment of the present invention. A dust removing device 310 includes plate-shaped piezoelectric elements 330 and a diaphragm 320. The piezoelectric elements 330 may each be a multilayered piezoelectric element according to an embodiment of the present invention. The material of the diaphragm 320 is not particularly limited. However, in the case where the dust removing device 310 is used in an optical device, a light-transmissive material or a light-reflective material can be used as the diaphragm 320. A light-transmissive portion or a light-reflective portion of the diaphragm is an object of dust removal.

Figure 10A:
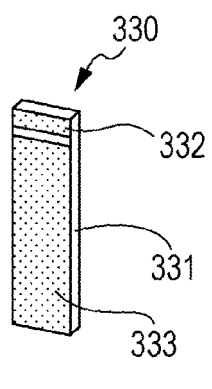
FIGS. 10A to 10C are each a schematic view showing a structure of a piezoelectric element in a dust removing device according to an embodiment of the present invention.
Figure 10B:
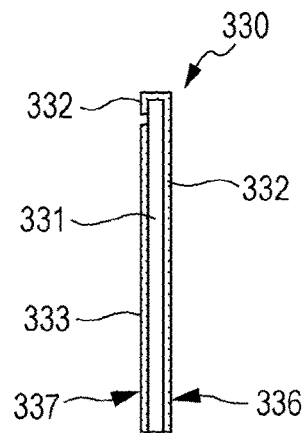
Figure 10C:
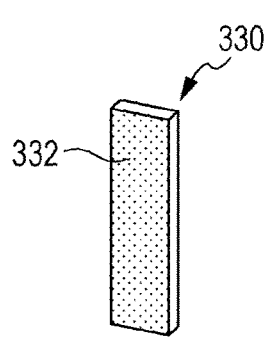

FIGS. 10A to 10C are each a schematic view showing a structure of the piezoelectric element 330 in FIGS. 9A and 9B. FIGS. 10A and 10C show the structures of a front surface and a back surface of the piezoelectric element 330. FIG. 10B shows the structure of a side surface of the piezoelectric element 330. As shown in FIGS. 9A and 9B and FIGS. 10A to 10C, the piezoelectric element 330 includes a piezoelectric material 331, a first electrode 332, and a second electrode 333. The first electrode 332 and the second electrode 333 are arranged on surfaces of the piezoelectric material 331 so as to face each other. Similarly to the case shown in FIGS. 9A and 9B, the piezoelectric elements 330 may each be a multilayered piezoelectric element according to an embodiment of the present invention. In such a case, the piezoelectric material 331 may have a structure in which piezoelectric material layers and internal electrodes are alternately stacked, and the internal electrodes may be alternately short-circuited through the first electrode 332 or the second electrode 333, whereby a driving waveform having different phases in each of the piezoelectric material layers can be provided. In FIG. 100, a surface which is disposed as a front surface of the piezoelectric element 330 and on which the first electrode 332 is provided is defined as a first electrode surface 336. In FIG. 10A, a surface which is disposed as a front surface of the piezoelectric element 330 and on which the second electrode 333 is provided is defined as a second electrode surface 337.

The term "electrode surface" refers to a surface of a piezoelectric element, the surface having an electrode thereon. For example, as shown in FIGS. 10A to 10C, the first electrode 332 may extend to the second electrode surface 337.

As shown in FIGS. 9A and 9B, the first electrode surface 336 of the piezoelectric element 330 is bonded to a surface of the diaphragm 320. When the piezoelectric element 330 is driven and a stress is generated between the piezoelectric element 330 and the diaphragm 320, out-of-plane vibration is generated in the diaphragm. The dust removing device 310 according to an embodiment of the present invention removes foreign matter such as dust adhering to a surface of the diaphragm 320 by using the out-of-plane vibration of the diaphragm 320. The term "out-of-plane vibration" refers to elastic vibration that displaces a diaphragm in an optical axis direction, that is, in a direction of the thickness of the diaphragm.

Figure 11A:
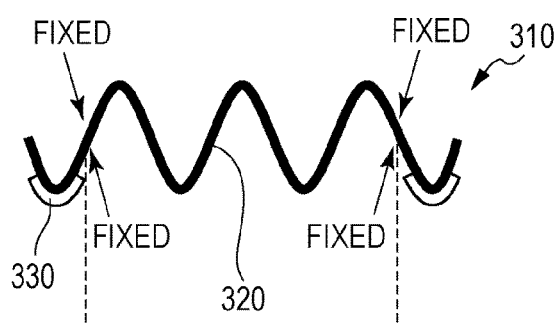
FIGS. 11A and 11B are each a schematic view showing a vibration principle of a dust removing device according to an embodiment of the present invention.
Figure 11B:
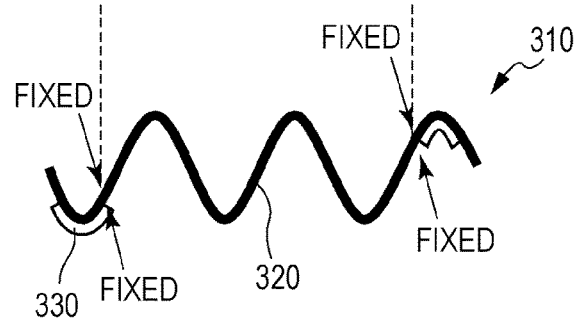

FIGS. 11A and 11B are each a schematic view showing a vibration principle of the dust removing device 310 according to an embodiment of the present invention. FIG. 11A shows a state in which out-of-plane vibration is generated in the diaphragm 320 by applying alternating voltages with the same phase to a pair of right and left piezoelectric elements 330. The polarization direction of the piezoelectric material constituting the pair of right and left piezoelectric elements 330 is the same as the direction of the thicknesses of the piezoelectric elements 330. The dust removing device 310 is driven in a seventh-order vibration mode. FIG. 11B shows a state in which out-of-plane vibration is generated in the diaphragm 320 by applying alternating voltages with opposite phases, which are opposite to each other by 180°, to a pair of right and left piezoelectric elements 330. The dust removing device 310 is driven in a sixth-order vibration mode. The dust removing device 310 according to an embodiment of the present invention can effectively remove dust adhering to a surface of the diaphragm by properly using at least two vibration modes.

Image Pickup Device

Figure 12:
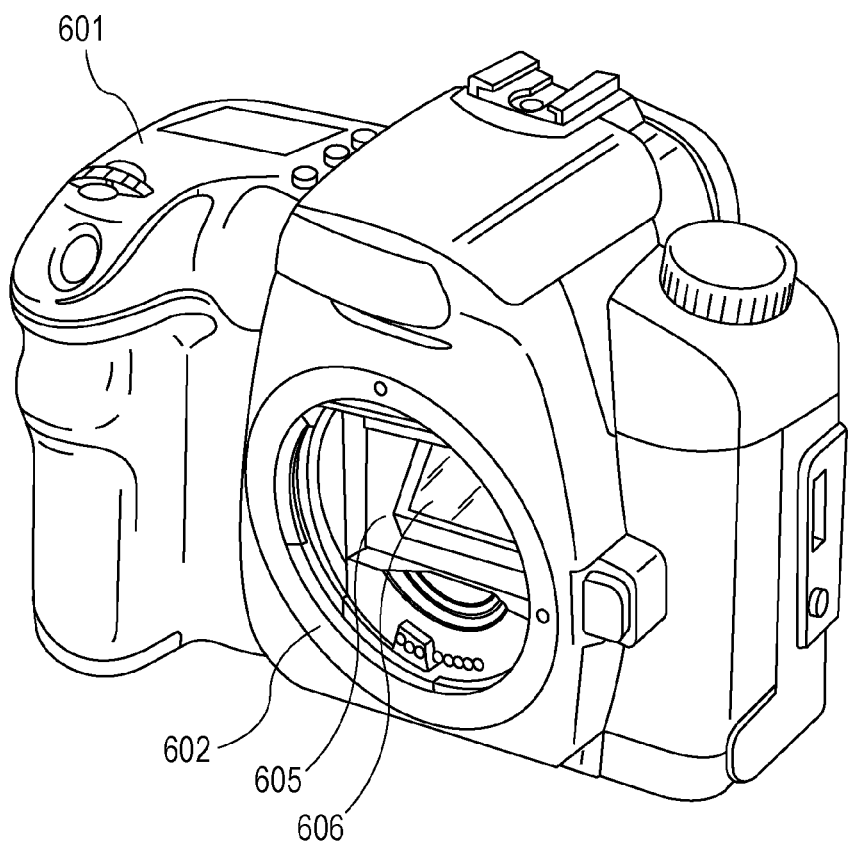
FIG. 12 is a schematic view showing an image pickup device according to an embodiment of the present invention.
Figure 13:
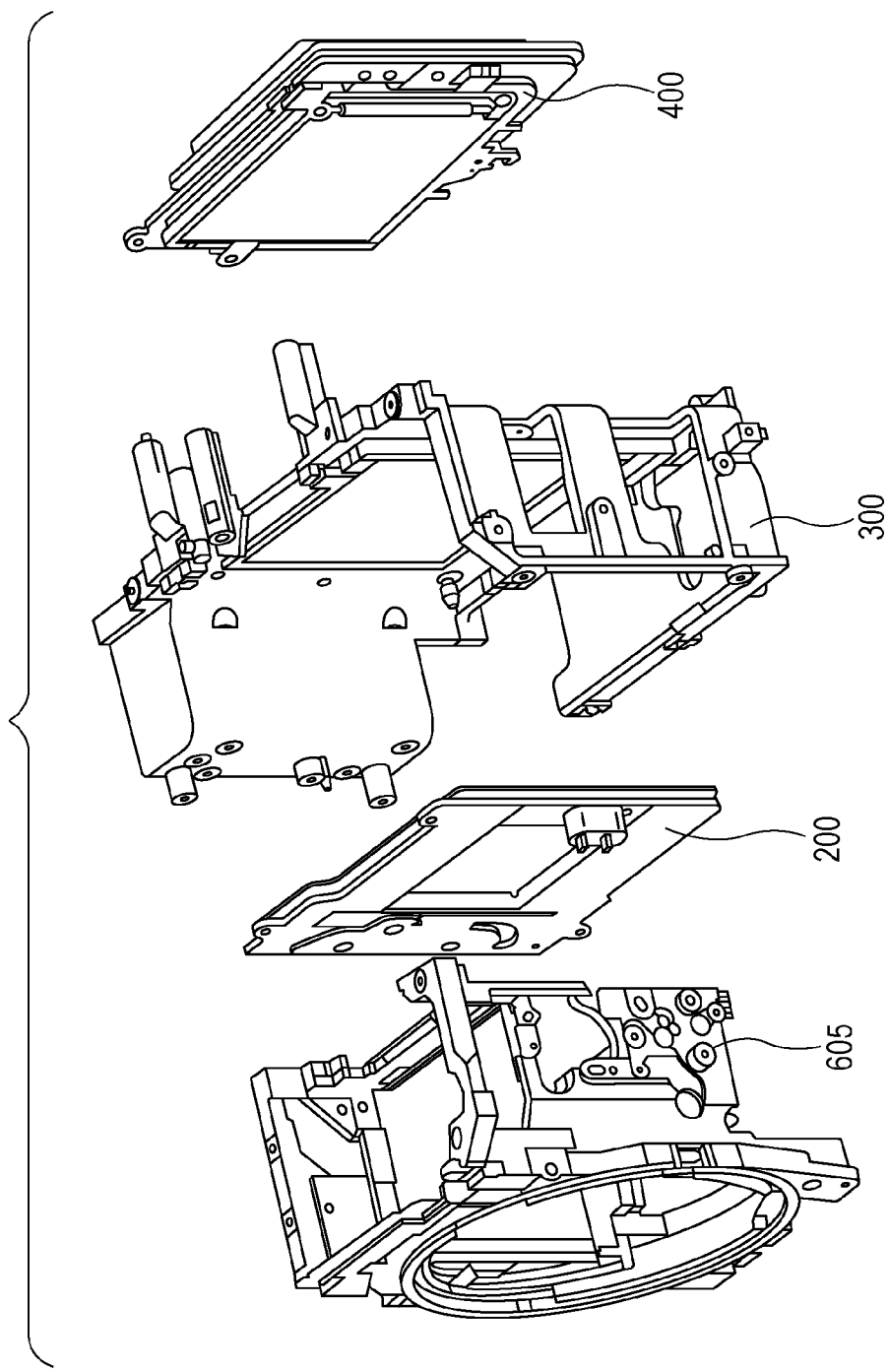
FIG. 13 is a schematic view showing an image pickup device according to an embodiment of the present invention.

An image pickup device according to an embodiment of the present invention will now be described. An image pickup device according to an embodiment of the present invention includes at least the dust removing device according to an embodiment of the present invention and an image pickup element unit, in which a diaphragm of the dust removing device is disposed on a light-receiving surface side of the image pickup element unit. FIGS. 12 and 13 are each a view showing a digital single-lens reflex camera, which is an example of an image pickup device according to an embodiment of the present invention.

FIG. 12 is a front-side perspective view of a camera main body 601 viewed from the object side and shows a state in which an imaging lens unit is detached. FIG. 13 is an exploded perspective view showing a schematic structure of the inside of the camera for illustrating a peripheral structure of the dust removing device according to an embodiment of the present invention and an image pickup unit 400.

In the camera main body 601 shown in FIG. 12, a mirror box 605 into which a photographic light flux transmitted through an imaging lens is guided is provided, and a main mirror (quick return mirror) 606 is provided in the mirror box 605. The main mirror 606 can take a state where it is held at an angle of 45° with respect to an imaging optical axis in order to guide the photographic light flux in a direction of a penta-dach mirror (not shown) or a state where it is held at a position retracted from the photographic light flux in order to guide the photographic light flux in a direction of an image pickup element (not shown).

In FIG. 13, the mirror box 605 and a shutter unit 200 are arranged on the object side of a body chassis 300, which functions as a skeleton of the camera main body, in that order from the object side. An image pickup unit 400 is disposed on the photographer side of the body chassis 300. The image pickup unit 400 includes a diaphragm of a dust removing device and an image pickup element unit. The diaphragm of the dust removing device is sequentially provided on the same axis as the light-receiving surface of the image pickup element unit. The image pickup unit 400 is arranged on a fitting surface of a mount portion 602 (FIG. 12), which functions as a reference for attaching the imaging lens unit. The image pickup unit 400 is adjusted so that an image pickup area of the image pickup element unit is arranged parallel to the imaging lens unit with a predetermined space therebetween.

A digital single-lens reflex camera has been described as an image pickup device according to an embodiment of the present invention. However, the image pickup device may be an imaging lens unit replaceable camera such as a mirror-less digital single-lens camera that does not include the mirror box 605. Furthermore, the image pickup device according to an embodiment of the present invention can be applied to various image pickup devices, such as an imaging lens unit replaceable video camera, a copy machine, a facsimile, and a scanner, or electronic and electrical apparatuses having image pickup devices, in particular, apparatuses which are required to remove dust adhering to surfaces of optical components therein.

Electronic Apparatus

An electronic apparatus according to an embodiment of the present invention will now be described. An electronic apparatus according to an embodiment of the present invention includes a piezoelectric acoustic component including the piezoelectric element or the multilayered piezoelectric element described above. Examples of the piezoelectric acoustic component include a speaker, a buzzer, a microphone, and a surface acoustic wave (SAW) element.

Figure 14:
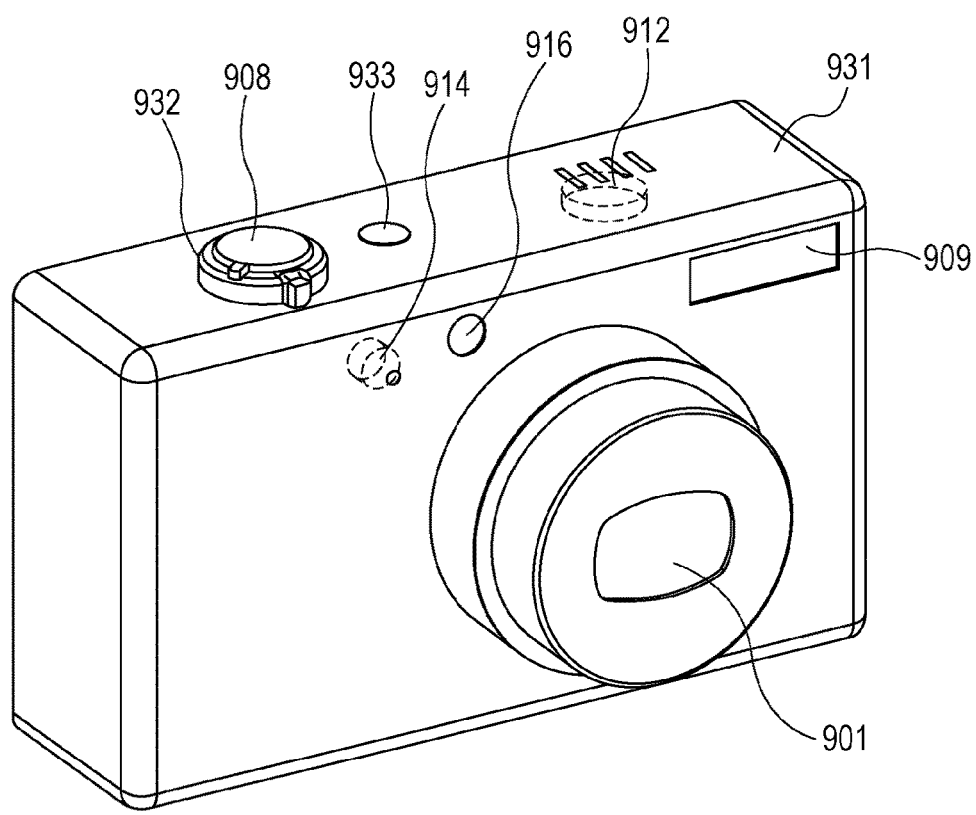
FIG. 14 is a schematic view showing an electronic apparatus according to an embodiment of the present invention.

FIG. 14 is an entire perspective view of a digital camera, which is an example of the electronic apparatus according to an embodiment of the present invention, as viewed from the front of a main body 931. An optical device 901, a microphone 914, a strobe light-emitting unit 909, and an auxiliary light unit 916 are disposed on the front surface of the main body 931. Since the microphone 914 is provided inside the main body 931, the microphone 914 is shown by a broken line. A hole for picking up a sound from the outside is provided at the front of the microphone 914.

A power button 933, a speaker 912, a zoom lever 932, and a release button 908 for performing a focusing operation are disposed on the upper surface of the main body 931. Since the speaker 912 is provided inside the main body 931, the speaker 912 is shown by a broken line. Holes for transmitting a sound to the outside are provided at the front of the speaker 912.

The piezoelectric acoustic component according to an embodiment of the present invention is used in at least one of the microphone 914, the speaker 912, and a surface acoustic wave element.

A digital camera has been described as an example of the electronic apparatus according to an embodiment of the present invention. However, the electronic apparatus may be applied to electronic apparatuses including various piezoelectric acoustic components such as a sound-reproducing apparatus, a sound-recording apparatus, a mobile phone, an information terminal, etc.

As described above, the piezoelectric element and the multilayered piezoelectric element according to an embodiment of the present invention can be suitably used in a liquid ejection head, a liquid ejection apparatus, an ultrasonic motor, an optical apparatus, a vibration apparatus, a dust removing device, an image pickup device, and an electronic apparatus.

By using the lead-free piezoelectric element according to an embodiment of the present invention, it is possible to provide a liquid ejection head having a nozzle density and an ejection force that are equivalent to or higher than those in the case of using a piezoelectric element containing lead.

By using the lead-free piezoelectric element according to an embodiment of the present invention, it is possible to provide a liquid ejection apparatus having an ejection speed and an ejection accuracy that are equivalent to or higher than those in the case of using a piezoelectric element containing lead.

By using the lead-free piezoelectric element according to an embodiment of the present invention, it is possible to provide an ultrasonic motor having a driving force and durability that are equivalent to or higher than those in the case of using a piezoelectric element containing lead.

By using the lead-free piezoelectric element according to an embodiment of the present invention, it is possible to provide an optical apparatus having durability and an operation accuracy that are equivalent to or higher than those in the case of using a piezoelectric element containing lead.

By using the lead-free piezoelectric element according to an embodiment of the present invention, it is possible to provide a vibration apparatus having a vibration capacity and durability that are equivalent to or higher than those in the case of using a piezoelectric element containing lead.

By using the lead-free piezoelectric element according to an embodiment of the present invention, it is possible to provide a dust removing device having a dust removing efficiency that is equivalent to or higher than that in the case of using a piezoelectric element containing lead.

By using the lead-free piezoelectric element according to an embodiment of the present invention, it is possible to provide an image pickup device having a dust removing performance that is equivalent to or higher than that in the case of using a piezoelectric element containing lead.

By using the lead-free piezoelectric element according to an embodiment of the present invention, it is possible to provide an electronic apparatus having sound generation properties that are equivalent to or higher than that in the case of using a piezoelectric element containing lead.

The piezoelectric element and the multilayered piezoelectric element according to an embodiment of the present invention are suitably used in piezoelectric actuators that may be exposed to a high-temperature atmosphere, for example, in an environment at 85° C. or lower.

EXAMPLES

The present invention will be more specifically described using Examples. However, the present invention is not limited to the Examples.

Piezoelectric materials and piezoelectric elements of the present invention were prepared as follows.

Piezoelectric Materials and Piezoelectric Elements of the Present Invention

Example 1

Raw materials corresponding to a composition $(Ba_{0.810}Ca_{0.140}Sn_{0.050})_{0.996}(Ti_{0.949}Zr_{0.051})O_3$ that is represented by a general formula $(Ba_{1-x-y}Ca_xSn_y)_\alpha(Ti_{1-z}Zr_z)O_3$ where $x=0.140$, $y=0.050$, $z=0.051$, and $\alpha=0.996$ were weighed in accordance with procedures described below.

A commercially available tin(II) oxide powder (average particle size of 600 nm, purity of 99.5% or more) was used as a Sn raw material. A barium titanate powder (average particle size of 100 nm, purity of 99.999% or more) having a perovskite structure produced by a solid-phase method, a perovskite-type calcium titanate powder (average particle size of 300 nm, purity of 99.999% or more), and a perovskite-type calcium zirconate powder (average particle size of 300 nm, purity of 99.999% or more) were used as raw materials of Ba, Ca, Ti, and Zr. These powders were weighed such that the ratio of Ba, Ca, Sn, Ti, and Zr satisfied the composition $(Ba_{0.810}Ca_{0.140}Sn_{0.050})_{0.996}(Ti_{0.949}Zr_{0.051})O_3$. Barium oxalate and titanium oxide were used in order to adjust α, which represents a molar ratio of the A-sites to the B-sites. These weighed powders were dry-mixed in a ball mill for 24 hours. The amount of Mg contained in the resulting mixed powder was measured by ICP emission spectroscopy. According to the result, 0.0001 parts by weight of Mg was contained relative to 100 parts by weight of the raw material powder. In order to granulate the mixed powder, manganese(II) acetate containing 0.18 parts by weight of Mn in terms of metal relative to the mixed powder and 3 parts by weight of a PVA binder relative to the mixed powder were caused to adhere to surfaces of particles of the mixed powder by using a spray dryer.

Next, a mold was filled with the granulated powder, and a molding pressure of 200 MPa was applied by using a press-molding machine to prepare a disk-shaped compact. The compact was placed in an electric furnace whose atmosphere could be changed. First, the compact was heated at 400° C. in an air atmosphere to remove the organic binder component. Next, a gas introduced was changed to a hydrogen-nitrogen mixed gas in the same electric furnace, the oxygen partial pressure was controlled to $1.0 \times 10^{-11}$ MPa, and the compact was then maintained at a maximum temperature of 1,380° C. for 5 hours. Next, the temperature was decreased to 1,100° C. while maintaining the same oxygen partial pressure, the oxygen partial pressure was increased to $3.0 \times 10^{-4}$ MPa, and the temperature was then decreased to 300° C. Thus, a disk-shaped sintered body (polycrystalline ceramic), which is a piezoelectric material of the present invention, was prepared.

The average equivalent circle diameter of crystal grains constituting the piezoelectric material and the relative density of the piezoelectric material were evaluated. According to the results, the average equivalent circle diameter was 2.1 μm and the relative density was 98.9%. A polarizing microscope was mainly used to observe crystal grains. When the grain sizes of small crystal grains were determined, a scanning electron microscope (SEM) was used. The average equivalent circle diameter was calculated by image processing of the observed image. The relative density was evaluated by the Archimedes method.

The prepared piezoelectric material was then polished so as to have a thickness of 0.5 mm and the crystal structure of the polished surface was analyzed by X-ray diffraction at room temperature (27° C.). According to the results, only a peak attributable to a tetragonal perovskite structure was observed as a single phase.

The composition of the piezoelectric material was evaluated by X-ray fluorescence analysis (XRF). According to the results, it was found that the piezoelectric material of this Example contained a metal oxide represented by a chemical formula $(Ba_{0.810}Ca_{0.140}Sn_{0.050})_{0.996}(Ti_{0.949}Zr_{0.051})O_3$ as a main component, 0.18 parts by weight of Mn, and 0.0001 parts by weight of Mg relative to 100 parts by weight of the main component. The Mg component is considered to be derived from Mg contained in the raw materials. Regarding other metal components, the composition determined by weighing was identical to the composition determined after sintering. Amounts of elements other than Ba, Ca, Sn, Ti, Zr, Mn, and Mg were the detection limits or lower. There was no substantial difference between the average equivalent circle diameter after sintering and the average equivalent circle diameter after polishing.

Next, a piezoelectric element of the present invention was prepared. Gold electrodes having a thickness of 400 nm were formed on the front and back surfaces of the disk-shaped piezoelectric material by a DC sputtering method. A titanium film having a thickness of 30 nm and functioning as an adhesive layer was deposited between each electrode and the piezoelectric material. The piezoelectric material with the electrodes was cut to prepare a strip-shaped element having dimensions of 10 mm×2.5 mm×0.5 mm. The element was placed on a hot plate having a surface temperature of 110° C. to 140° C., and a polarization treatment was performed by applying an electric field of 1.2 kV/mm between the electrodes for 30 minutes. Thus, a piezoelectric element of the present invention was produced in which the piezoelectric material had a portion sandwiched between the electrodes, and the portion had remanent polarization in a direction perpendicular to the electrode surfaces.

Examples 2 to 23

Piezoelectric materials and piezoelectric elements of Examples 2 to 23 were prepared as in Example 1. However, the weighing ratio of each of the components used as raw materials of the piezoelectric materials was changed to the ratio shown in Table 1. For piezoelectric materials having a Zr ratio (z) higher than a Ca ratio (x), a perovskite-type barium zirconate (average particle size of 300 nm, purity of 99.999% or more) produced by a solid-phase method was used instead of the perovskite-type calcium zirconate powder. In Examples 20 to 23, in order to adjust the Mg content, 0.0049 parts by weight (Example 20), 0.0499 parts by weight (Example 21), 0.0999 parts by weight (Example 22), and 0.1199 parts by weight (Example 23) of magnesium oxide were respectively added to the raw material mixed powder relative to 100 parts by weight of the total weight (sum) of the raw materials in terms of chemical formula of $(Ba_{1-x-y}Ca_xSn_y)_\alpha(Ti_{1-z}Zr_z)O_3$. Dry-mixing of each of the resulting mixtures was performed by using a ball mill for 24 hours.

The average equivalent circle diameter and the relative density of each of the piezoelectric materials of Examples 2 to 23 were also evaluated as in Example 1. Table 2 shows the results. Table 1 shows the results of composition analysis performed as in Example 1. It is considered that 0.0001 parts by weight of Mg in the Mg component was derived from the raw materials. Regarding other metal components, the composition determined by weighing was identical to the composition determined after sintering with respect to the denoted number of significant digits. According to the results of X-ray diffraction analysis at room temperature, in each of the piezoelectric materials of Examples 2 to 23, only a peak attributable to a tetragonal perovskite structure was observed as a single phase.

TABLE 1

| | Main component | | | | | | First sub-component | Second sub-component |
|---|---|---|---|---|---|---|---|---|
| | Ba<br>1 − x − y | Ca<br>x | Sn<br>y | Ti<br>1 − z | Zr<br>z | A/B<br>α | Mn<br>[Parts by weight] | Mg<br>[Parts by weight] |
| Example 1 | 0.810 | 0.140 | 0.050 | 0.949 | 0.051 | 0.996 | 0.18 | 0.0001 |
| Example 2 | 0.960 | 0.020 | 0.020 | 0.949 | 0.051 | 1.000 | 0.18 | 0.0001 |
| Example 3 | 0.880 | 0.100 | 0.020 | 0.949 | 0.051 | 1.000 | 0.40 | 0.0001 |
| Example 4 | 0.860 | 0.120 | 0.020 | 0.930 | 0.070 | 1.000 | 0.36 | 0.0001 |
| Example 5 | 0.830 | 0.150 | 0.020 | 0.930 | 0.070 | 1.000 | 0.30 | 0.0001 |
| Example 6 | 0.780 | 0.200 | 0.020 | 0.915 | 0.085 | 1.000 | 0.24 | 0.0001 |
| Example 7 | 0.760 | 0.140 | 0.100 | 0.945 | 0.055 | 0.996 | 0.18 | 0.0001 |
| Example 8 | 0.710 | 0.140 | 0.150 | 0.940 | 0.060 | 0.996 | 0.18 | 0.0001 |
| Example 9 | 0.660 | 0.140 | 0.200 | 0.920 | 0.080 | 0.991 | 0.18 | 0.0001 |
| Example 10 | 0.780 | 0.020 | 0.200 | 0.915 | 0.085 | 0.986 | 0.40 | 0.0001 |
| Example 11 | 0.700 | 0.100 | 0.200 | 0.915 | 0.085 | 0.989 | 0.04 | 0.0001 |
| Example 12 | 0.600 | 0.200 | 0.200 | 0.949 | 0.051 | 1.050 | 0.18 | 0.0001 |
| Example 13 | 0.930 | 0.020 | 0.050 | 0.930 | 0.070 | 0.996 | 0.18 | 0.0001 |
| Example 14 | 0.850 | 0.100 | 0.050 | 0.940 | 0.060 | 0.996 | 0.18 | 0.0001 |
| Example 15 | 0.770 | 0.180 | 0.050 | 0.945 | 0.055 | 1.100 | 0.18 | 0.0001 |
| Example 16 | 0.850 | 0.050 | 0.100 | 0.940 | 0.060 | 0.996 | 0.18 | 0.0001 |
| Example 17 | 0.680 | 0.170 | 0.150 | 0.940 | 0.060 | 0.996 | 0.18 | 0.0001 |
| Example 18 | 0.810 | 0.140 | 0.050 | 0.949 | 0.051 | 0.996 | 0.00 | 0.0001 |
| Example 19 | 0.810 | 0.140 | 0.050 | 0.949 | 0.051 | 0.996 | 0.45 | 0.0001 |
| Example 20 | 0.810 | 0.140 | 0.050 | 0.949 | 0.051 | 0.996 | 0.18 | 0.0050 |
| Example 21 | 0.810 | 0.140 | 0.050 | 0.949 | 0.051 | 0.996 | 0.18 | 0.0500 |
| Example 22 | 0.810 | 0.140 | 0.050 | 0.949 | 0.051 | 0.996 | 0.18 | 0.1000 |
| Example 23 | 0.810 | 0.140 | 0.050 | 0.949 | 0.051 | 0.996 | 0.18 | 0.1200 |
| Com. Ex. 1 | 0.950 | 0.000 | 0.050 | 0.940 | 0.060 | 0.984 | 0.18 | 0.0001 |
| Com. Ex. 2 | 0.700 | 0.250 | 0.050 | 0.940 | 0.060 | 1.150 | 0.18 | 0.0001 |
| Com. Ex. 3 | 0.860 | 0.140 | 0.000 | 0.915 | 0.085 | 0.996 | 0.18 | 0.0001 |
| Com. Ex. 4 | 0.610 | 0.140 | 0.250 | 0.949 | 0.051 | 0.996 | 0.18 | 0.0001 |
| Com. Ex. 5 | 0.810 | 0.140 | 0.050 | 1.000 | 0.000 | 0.996 | 0.18 | 0.0001 |
| Com. Ex. 6 | 0.810 | 0.140 | 0.050 | 0.810 | 0.090 | 0.996 | 0.18 | 0.0001 |

Com. EX.: Comparative Example

TABLE 2

| | Average equivalent circle diameter [μm] | Relative density [%] |
|---|---|---|
| Example 1 | 2.1 | 98.9 |
| Example 2 | 3.4 | 95.0 |
| Example 3 | 3.5 | 94.2 |
| Example 4 | 1.9 | 96.1 |
| Example 5 | 3.6 | 93.9 |
| Example 6 | 4.4 | 97.8 |
| Example 7 | 3.8 | 96.2 |
| Example 8 | 7.2 | 93.2 |
| Example 9 | 7.0 | 95.3 |
| Example 10 | 9.8 | 94.5 |
| Example 11 | 4.5 | 97.5 |
| Example 12 | 3.0 | 96.9 |
| Example 13 | 5.8 | 94.2 |
| Example 14 | 4.6 | 97.4 |
| Example 15 | 0.3 | 99.0 |
| Example 16 | 9.5 | 97.5 |
| Example 17 | 2.6 | 98.3 |
| Example 18 | 0.4 | 99.4 |
| Example 19 | 8.5 | 94.0 |
| Example 20 | 6.7 | 94.5 |
| Example 21 | 5.3 | 93.1 |
| Example 22 | 4.5 | 92.7 |
| Example 23 | 2.8 | 91.9 |
| Comparative Example 1 | 94.0 | 91.2 |
| Comparative Example 2 | 0.2 | 98.5 |
| Comparative Example 3 | 3.7 | 94.5 |
| Comparative Example 4 | 2.5 | 87.8 |
| Comparative Example 5 | 115.0 | 92.8 |
| Comparative Example 6 | 0.9 | 91.5 |

Effect of Sintering Temperature

Even when piezoelectric materials were prepared by the same steps as in Examples 1 to 23 except that the maximum temperature of sintering was changed to each of 1,200° C. and 1,400° C., the composition determined by weighing was identical to the composition determined after sintering, and the crystal structure of each of the piezoelectric materials was a single phase of a perovskite-structure. In addition, the average equivalent circle diameter was in the range of 0.3 to 10 μm and the relative density was 91.9% or more.

Effect of Raw Materials Used

Piezoelectric materials were prepared as in Examples 1 and 2 except that a powder prepared by reducing a commercially available tin(IV) oxide powder (average particle size of 300 nm, purity of 99.9% or more) in a hydrogen-nitrogen mixed gas atmosphere at an oxygen partial pressure of $1.0 \times 10^{-10}$ to $1.0 \times 10^{-12}$ MPa at 1,200° C. was used as a Sn raw material. Regarding each of the piezoelectric materials, the composition determined by weighing was identical to the composition determined after sintering. The crystal structure of each of the piezoelectric materials was a single phase of a perovskite structure. The piezoelectric materials had average equivalent circle diameters of 2.6 μm and 3.5 μm and relative densities of 98.5% and 95.4%, respectively.

Comparative Examples 1 to 6

A ceramic and an element of Comparative Example 1 were prepared by the same steps as in Example 2. Ceramics and elements of Comparative Examples 2 to 6 were prepared by the same steps as in Example 1. The weighing ratio of each of the components in the preparation of the ceramics for comparison was the ratio shown in Table 1. The maximum temperature of sintering of the ceramic contained in the element of Comparative Example 5 was 1400° C. at which the piezoelectric constant was maximized. The average equivalent circle diameter and the relative density of each of the ceramics for comparison were evaluated as in Example 1. The results are shown in Table 2. Next, the composition analysis was conducted as in Example 1. According to the results, it was found that, in each of the samples, the composition determined by weighing and shown in Table 1 was identical to the composition determined after sintering with respect to the denoted number of significant digits. Regarding the ceramics prepared in Comparative Examples 1 and 5, abnormal grain growth was observed in the ceramics, and cracks and chipping were generated in the process for preparing elements. These results showed that the mechanical strength was insufficient. Regarding the ceramic prepared in Comparative Example 2, sintering was insufficient. In each of the ceramics prepared in Comparative Examples 2, 3, 5, and 6, only a peak attributable to a tetragonal perovskite structure was observed as a single phase in X-ray diffraction analysis. In contrast, the ceramics prepared in Comparative Examples 1 and 4 contained a large amount of an impurity phase (Sn-containing compound) having a non-perovskite structure. The element prepared in Comparative Example 4 had low insulation properties, and thus a polarization treatment could not be performed. Therefore, electric properties of the element were not evaluated.

Figure 15A:
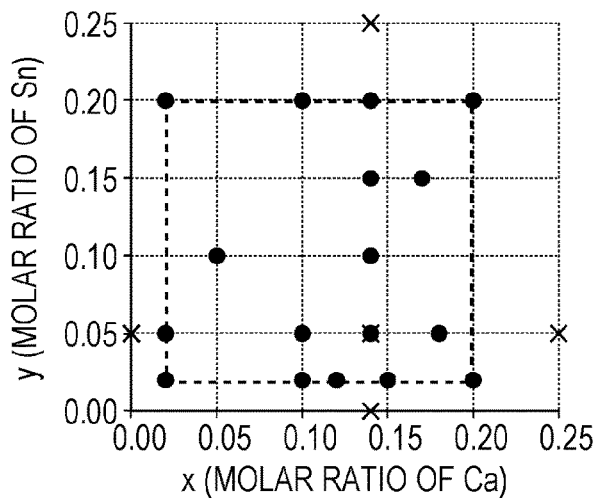
FIGS. 15A to 15C are graphs showing the relationship between the compositions of piezoelectric materials of Examples 1 to 23 of the present invention and the compositions of ceramics of Comparative Examples 1 to 6.
Figure 15B:
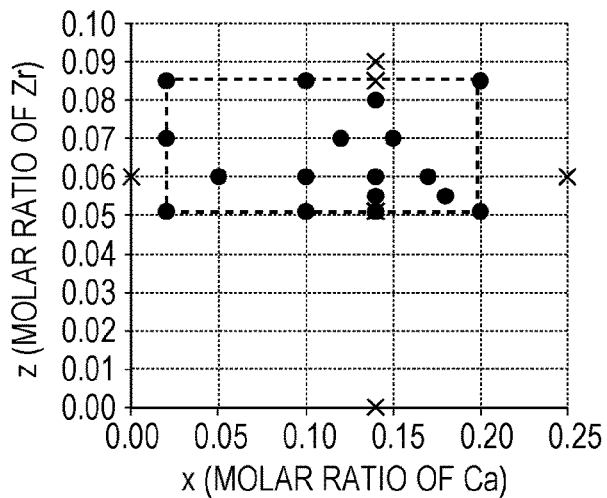
Figure 15C:
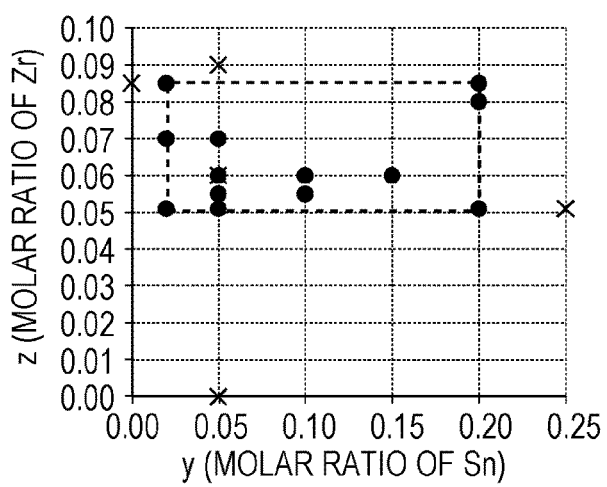

FIGS. 15A to 15C are graphs showing the relationship between the compositions of piezoelectric materials of Examples 1 to 23 of the present invention and the compositions of the ceramics of Comparative Examples 1 to 6. In FIGS. 15A to 15C, the composition of each of the Examples is denoted by the symbol of a black circle, and the composition of each of the Comparative Examples is denoted by the symbol of x. In FIGS. 15A to 15C, a composition range of general formula (1) is shown by the dotted lines. Evaluation of properties of piezoelectric elements and elements for comparison Regarding the piezoelectric elements obtained in Examples 1 to 23 and the elements obtained in Comparative Examples 1 to 6, a piezoelectric constant $d_{31}$ at room temperature (27° C.), a mechanical quality factor $Q_m$ at room temperature, a resistivity R at room temperature, a depolarization temperature $T_d$, and a ratio of the piezoelectric constant $d_{31}$ between before and after a reliability test in which the element was allowed to stand in a high-temperature environment were evaluated. The results are shown in Table 3. The element obtained in Comparative Example 4 had a low resistivity, and a polarization treatment could not be performed. Therefore, only the resistivity R is shown in Table 3.

The piezoelectric constant $d_{31}$ was determined by the resonance-antiresonance method at room temperature, and an absolute value thereof is described in the table. The mechanical quality factor $Q_m$ was determined by the resonance-antiresonance method at the same time as the piezoelectric constant. The resistivity R was measured by applying a DC voltage of 10 V between two facing electrode of the element, and determined from a leakage current after 20 seconds. When the resistivity is $1.0 \times 10^9$ Ω·cm or more and preferably $3.0 \times 10^{10}$ Ω·cm or more, the piezoelectric element is considered to have sufficient insulation properties in practical use. A piezoelectric constant $d_{33}$ was used as an indicator for determining the depolarization temperature $T_d$. The piezoelectric constant $d_{33}$ was measured by using a piezoelectric constant $d_{33}$ measuring meter (Alpha Corporation) based on the Berlincourt method. The element was placed on a hot plate that was maintained at a constant temperature for 10 minutes, and then allowed to cool in the air. The piezoelectric constant $d_{33}$ of this element was measured at room temperature. The holding temperature was sequentially increased from 25° C. to 160° C. at intervals of 5° C., and the piezoelectric constant was repeatedly measured. A temperature at which the piezoelectric constant became less than 90% of the initial piezoelectric constant was determined as the depolarization temperature $T_d$. In order to evaluate a change in piezoelectric properties when the element was exposed to a high-temperature environment, the following heating test was conducted. An element whose piezoelectric constant $d_{31}$ had been measured was allowed to stand in a constant-temperature dryer of 85° C. for 24 hours and taken out from the dryer, and the piezoelectric constant $d_{31}$ at room temperature after 24 hours was then measured to determine a change in the piezoelectric constant before and after the heating test. Table 3 shows, in units of percentage, a ratio piezoelectric constant after high-temperature exposure test/piezoelectric constant before high-temperature exposure test.

TABLE 3

| | Piezo-electric constant $|d_{31}|$ [pm/V] | Mechanical quality factor $Q_m$ [—] | DC resistance R [$10^9$ Ω·cm] | Depolarization temperature $T_d$ [° C.] | $|d_{31}|$ Ratio before and after high-temperature test |
|---|---|---|---|---|---|
| Example 1 | 82 | 910 | 310 | 125 | 100% |
| Example 2 | 96 | 670 | 370 | 115 | 98% |
| Example 3 | 98 | 1200 | 640 | 115 | 98% |
| Example 4 | 107 | 1100 | 550 | 105 | 95% |
| Example 5 | 106 | 1050 | 560 | 105 | 95% |
| Example 6 | 102 | 1000 | 500 | 100 | 93% |
| Example 7 | 99 | 890 | 360 | 120 | 100% |
| Example 8 | 113 | 850 | 350 | 110 | 96% |
| Example 9 | 111 | 860 | 300 | 100 | 93% |
| Example 10 | 114 | 1450 | 660 | 95 | 91% |
| Example 11 | 112 | 640 | 120 | 100 | 93% |
| Example 12 | 87 | 880 | 290 | 140 | 100% |
| Example 13 | 110 | 900 | 300 | 105 | 95% |
| Example 14 | 100 | 870 | 240 | 110 | 97% |
| Example 15 | 93 | 1040 | 300 | 125 | 100% |
| Example 16 | 103 | 780 | 440 | 110 | 97% |
| Example 17 | 98 | 860 | 280 | 110 | 97% |
| Example 18 | 84 | 450 | 55 | 120 | 100% |
| Example 19 | 80 | 1550 | 760 | 130 | 100% |
| Example 20 | 80 | 1000 | 230 | 125 | 100% |
| Example 21 | 79 | 1120 | 310 | 125 | 100% |
| Example 22 | 78 | 1140 | 160 | 125 | 100% |
| Example 23 | 72 | 750 | 30 | 125 | 100% |
| Comparative Example 1 | 46 | 260 | 1.1 | 60 | 13% |
| Comparative Example 2 | 29 | 640 | 42 | 110 | 96% |
| Comparative Example 3 | 68 | 350 | 180 | 70 | 28% |
| Comparative Example 4 | Could not be evaluated | Could not be evaluated | 0.0045 | Could not be evaluated | Could not be evaluated |
| Comparative Example 5 | 33 | 590 | 210 | 130 | 100% |
| Comparative Example 6 | 99 | 420 | 230 | 85 | 72% |

Effect of Electrode Materials

Even when piezoelectric elements of the present invention were prepared by the same steps as in Example 1 to 23 except that the electrodes were formed by baking a silver paste, the piezoelectric elements also had properties substantially the same as those of the piezoelectric elements of the present invention including gold electrodes.

Properties of Examples and Comparative Examples

The absolute value of piezoelectric constant $d_{31}$ of each of the piezoelectric elements of Examples 1 to 23 was as large as 70 or more, and thus the piezoelectric elements were suitable for practical use in a piezoelectric device. The mechanical quality factor $Q_m$ of each of the piezoelectric elements of Examples 1 to 23 was 450 or more, and thus the piezoelectric elements were suitable for practical use in a resonant piezoelectric device. The resistivity R of each of the piezoelectric elements of Examples 1 to 23 was as high as $30 \times 10^9$ Ω·cm or more, and thus the piezoelectric elements were suitable for practical use in a device in which piezoelectric strain is generated in a high electric field. The depolarization temperature $T_d$ of each of the piezoelectric elements of Examples 1 to 23 was as high as 95° C. or higher. The piezoelectric constant ratio before and after the high-temperature test of each of the piezoelectric elements of Examples 1 to 23 was as high as 91% or more.

The element of Comparative Example 1 did not contain Ca, which accelerates A-site solid solution of Sn, and thus an impurity phase was present. Consequently, a sufficient piezoelectric constant $d_{31}$ was not obtained, the resistivity R was low, and a decrease in the performance occurred in the high-temperature test. Furthermore, regarding ceramics that do not contain Ca, the phase transition temperature between the orthorhombic structure and the tetragonal structure is present around room temperature. Accordingly, the piezoelectric properties significantly change with respect to the temperature, resulting in the difficulty in device design.

The element of Comparative Example 2 contained excess Ca and showed a decrease in the piezoelectric properties.

The element of Comparative Example 3 did not contain Sn, and the effect of increasing the depolarization temperature was not obtained. Therefore, a decrease in the performance due to the high-temperature test occurred.

The element of Comparative Example 4 contained excess Sn and showed a decrease in the resistivity.

The element of Comparative Example 5 did not contain Zr and did not exhibit sufficient piezoelectric properties.

The element of Comparative Example 6 contained excess Zr and thus had a low depolarization temperature. Consequently, a decrease in the performance due to the high-temperature test occurred.

Piezoelectric Element Having Second Region

Example 24

The piezoelectric element shown in FIGS. 1B and 1C was prepared by using the same piezoelectric material as that used in Example 1. The piezoelectric material contains a metal oxide that can be represented by a chemical formula $(Ba_{0.810}Ca_{0.140}Sn_{0.050})_{0.996}(Ti_{0.949}Zr_{0.051})O_3$ as a main component, 0.18 parts by weight of Mn and 0.0001 parts by weight of Mg relative to 100 parts by weight of the main component. The piezoelectric material was processed so as to have a doughnut disk shape having an outer diameter of 70 mm, an inner diameter of 55 mm, and a thickness of 0.5 mm. Gold electrodes having a thickness of 400 nm were formed on the front and back surfaces of the piezoelectric material by a DC sputtering method. A titanium film having a thickness of 30 nm and functioning as an adhesive layer was deposited between each electrode and the piezoelectric material. The electrode on the front surface was patterned by using a metal mask as shown in FIG. 1B. The element was placed on a hot plate having a surface temperature of 110° C. to 140° C., and an electric field of 1.2 kV/mm was applied between the electrodes on the front and back surfaces for 30 minutes to perform a polarization treatment. In this case, a positive electric field was applied to electrode portions marked with the sign of "+" in FIG. 1B, and a negative electric field was applied to electrode portions marked with the sign of "−" in FIG. 1B, thus producing a piezoelectric element of the present invention having a first region and a second region that had remanent polarization with different polarities.

The piezoelectric element was cut along the electrode pattern on the front surface and evaluated as in Example 1. Properties substantially the same as those of Example 1 were observed except that the plus and minus directions of the piezoelectric constant were different in respective regions.

Next, a multilayered piezoelectric element of the present invention was prepared.

Multilayered Piezoelectric Element

Example 25

Raw materials corresponding to a composition $(Ba_{0.810}Ca_{0.140}Sn_{0.050})_{0.996}(Ti_{0.949}Zr_{0.051})O_3$ that is represented by a general formula $(Ba_{1-x-y}Ca_xSn_y)_\alpha(Ti_{1-z}Zr_z)O_3$ where x=0.140, y=0.050, z=0.051, and α=0.996 were weighed in accordance with procedures described below.

A commercially available a tin(II) oxide powder (average particle size of 600 nm, purity of 99.5% or more) was used as a Sn raw material. A barium titanate powder (average particle size of 100 nm, purity of 99.999% or more) having a perovskite structure produced by a solid-phase method, a perovskite-type calcium titanate powder (average particle size of 300 nm, purity of 99.999% or more), and a perovskite-type calcium zirconate powder (average particle size of 300 nm, purity of 99.999% or more) were used as raw materials of Ba, Ca, Ti, and Zr. These powders were weighed such that the ratio of Ba, Ca, Sn, Ti, and Zr satisfied the composition $(Ba_{0.810}Ca_{0.140}Sn_{0.050})_{0.996}(Ti_{0.949}Zr_{0.051})O_3$. Barium oxalate and titanium oxide were used in order to adjust α, which represents a molar ratio of the A-sites to the B-sites.

Manganese dioxide containing 0.18 parts by weight of Mn in terms of metal relative to 100 parts by weight of the composition $(Ba_{0.810}Ca_{0.140}Sn_{0.050})_{0.996}(Ti_{0.949}Zr_{0.051})O_3$ was added.

Silicon dioxide containing 0.014 parts by weight of Si in terms of metal and boron oxide containing 0.0066 parts by weight of B relative to 100 parts by weight of the composition $(Ba_{0.810}Ca_{0.140}Sn_{0.050})_{0.996}(Ti_{0.949}Zr_{0.051})O_3$ were added.

A polyvinyl butyral (PVB) binder was added to the resulting mixed powder and mixed. The resulting mixture was then formed into a sheet by a doctor blade method to prepare a green sheet having a thickness of 50 μm.

A conductive paste for internal electrodes was printed on the green sheet. A silver (Ag) 70%-palladium (Pd) 30% alloy (Ag/Pd=2.33) paste was used as the conductive paste. Nine green sheets on which the conductive paste had been applied were stacked. The resulting laminate was placed in an electric furnace whose atmosphere could be changed. First, the laminate was heated at 400° C. in an air atmosphere to remove the organic binder component. Next, a gas introduced was changed to a hydrogen-nitrogen mixed gas in the same electric furnace, the oxygen partial pressure was controlled to $1.0 \times 10^{-10}$ MPa, and the laminate was then maintained at a maximum temperature of 1,150° C. for 5 hours. Next, the temperature was decreased to 1,000° C. while maintaining the same oxygen partial pressure, the oxygen partial pressure was increased to $3.0 \times 10^{-4}$ MPa, and the temperature was then decreased to 300° C. Thus, a sintered body was prepared.

The composition of a piezoelectric material portion of the sintered body prepared as described above was evaluated by ICP emission spectroscopy. According to the results, it was found that the piezoelectric material portion contained a metal oxide that can be represented by a chemical formula $(Ba_{0.810}Ca_{0.140}Sn_{0.050})_{0.996}(Ti_{0.949}Zr_{0.051})O_3$ as a main component, and 0.18 parts by weight of Mn and 0.0001 parts by weight of Mg relative to 100 parts by weight of the main component.

Regarding other metal components, the composition determined by weighing was identical to the composition determined after sintering. Amounts of elements other than Ba, Ca, Sn, Ti, Zr, Mn, Mg, Si, and B were the detection limits of the ICP emission spectroscopy or lower.

The sintered body was cut to have dimensions of 10 mm×2.5 mm, and side surfaces of the sintered body were then polished. A pair of external electrodes (first electrode and second electrode) for alternately short-circuiting internal electrodes was formed by Au sputtering. Thus, a multilayered piezoelectric element as shown in FIG. 2B was prepared.

The multilayered piezoelectric element included nine piezoelectric material layers and eight internal electrodes.

According to a result of observation of the internal electrodes of the multilayered piezoelectric element, Ag—Pd, which was an electrode material, and the piezoelectric material were alternately formed.

Prior to the evaluation of piezoelectric properties, a polarization treatment was performed on the sample. Specifically, the sample was heated on a hot plate at 100° C. to 150° C., and a voltage of 1.4 kV/mm was applied between the first electrode and the second electrode for 30 minutes. The sample was cooled to room temperature while applying the voltage.

According to the evaluation results of piezoelectric properties of the resulting multilayered piezoelectric element, the multilayered piezoelectric element had sufficient insulation properties and had good piezoelectric properties substantially the same as those of the piezoelectric element of Example 1. It was also confirmed that the directions of remanent polarization of the piezoelectric material layers were alternate to each other with respect to a direction in which the piezoelectric material layers were stacked.

Example 26

A conductive paste for internal electrodes was printed on a green sheet prepared as in Example 25. A nickel (Ni) paste was used as the conductive paste. Nine green sheets on which the conductive paste had been applied were stacked, and the resulting laminate was subjected to thermocompression bonding.

The thermocompression-bonded laminate was placed in an electric furnace whose atmosphere could be changed. First, the laminate was heated at 400° C. in an air atmosphere to remove the organic binder component. Next, a gas introduced was changed to a hydrogen-nitrogen mixed gas in the same electric furnace, the oxygen partial pressure was controlled to $1.0 \times 10^{-10}$ MPa, and the laminate was then maintained at a maximum temperature of 1,150° C. for 5 hours. Next, the temperature was decreased to 1,000° C. while maintaining the same oxygen partial pressure, the oxygen partial pressure was increased to $3.0 \times 10^{-4}$ MPa, and the temperature was then decreased to 300° C. Thus, a sintered body was prepared.

The sintered body prepared as described above was cut to have dimensions of 10 mm×2.5 mm, and side surfaces of the sintered body were then polished. A pair of external electrodes (first electrode and second electrode) for alternately short-circuiting internal electrodes was formed by Au sputtering. Thus, a multilayered piezoelectric element as shown in FIG. 2B was prepared.

According to a result of observation of the internal electrodes of the multilayered piezoelectric element, Ni, which was an electrode material (constituting an electrode layer), and the piezoelectric material layers were alternately formed. The multilayered piezoelectric element was heated on a hot plate at 80° C., and a voltage of 1.4 kV/mm was applied between the first electrode and the second electrode for 30 minutes. The multilayered piezoelectric element was cooled to room temperature while the voltage was applied.

According to the evaluation results of piezoelectric properties of the resulting multilayered piezoelectric element, the multilayered piezoelectric element had sufficient insulation properties and had good piezoelectric properties substantially the same as those of the piezoelectric element of Example 1. It was also confirmed that the directions of remanent polarization of the piezoelectric material layers were alternate to each other with respect to a direction in which the piezoelectric material layers were stacked.

Comparative Example 7

A multilayered piezoelectric element was prepared as in Example 25 except that the internal electrodes were formed by using a Ag 95%-Pd 5% alloy (Ag/Pd=19).

According to a result of observation of the internal electrodes with a scanning electron microscope, the internal electrodes were melted and dotted in the form of islands. Furthermore, the alloy electrodes were reduced and electrical conductivity was significantly decreased. Consequently, polarization could not be performed due to non-conduction of the internal electrodes. Therefore, the piezoelectric constant could not be measured.

Comparative Example 8

A multilayered piezoelectric element was prepared as in Comparative Example 7 except that the internal electrodes were formed by using a Ag 5%-Pd 95% alloy (Ag/Pd=0.05).

According to a result of observation of the internal electrodes observed with a scanning electron microscope, sintering of Ag—Pd, which was an electrode material, was insufficient. Consequently, polarization could not be performed due to non-conduction of the internal electrodes. Therefore, the piezoelectric constant could not be measured.

Example 27

A liquid ejection head shown in FIGS. 3A and 3B was produced by using the piezoelectric element of Example 1. Ejection of an ink in response to an input electrical signal was confirmed.

Example 28

A liquid ejection apparatus shown in FIG. 4 was produced by using the liquid ejection head of Example 27. Ejection of an ink in response to an input electrical signal was confirmed on an object.

Example 29

An ultrasonic motor shown in FIG. 6A was produced by using the piezoelectric element of Example 1. Rotation of the motor in response to an application of an alternating voltage was confirmed.

Example 30

An optical apparatus shown in FIGS. 7A and 7B was produced by using the ultrasonic motor of Example 29. An automatic focusing operation in response to an application of an alternating voltage was confirmed.

Example 31

A dust removing device shown in FIGS. 9A and 9B was produced by using the piezoelectric element of Example 1. Plastic beads were dispersed on a surface of a diaphragm, and an alternating voltage was applied. As a result, a good dust removal ratio was confirmed.

Example 32

An image pickup device shown in FIG. 12 was produced by using the dust removing device of Example 31. When the image pickup device was operated, dust adhering to a surface of an image pickup unit was satisfactorily removed and an image without dust defects was obtained.

Example 33

An electronic apparatus shown in FIG. 14 was produced by using the piezoelectric element of Example 1. The operation of the speaker in response to an application of an alternating voltage was confirmed.

Example 34

A liquid ejection head shown in FIGS. 3A and 3B was produced by using the multilayered piezoelectric element of Example 26. Ejection of an ink in response to an input electrical signal was confirmed.

Example 35

A liquid ejection apparatus shown in FIG. 4 was produced by using the liquid ejection head of Example 34. Ejection of an ink in response to an input electrical signal was confirmed on a recording medium.

Example 36

An ultrasonic motor shown in FIG. 6B was produced by using the multilayered piezoelectric element of Example 26. Rotation of the motor in response to an application of an alternating voltage was confirmed.

Example 37

An optical apparatus shown in FIGS. 7A and 7B was produced by using the ultrasonic motor of Example 36. An automatic focusing operation in response to an application of an alternating voltage was confirmed.

Example 38

A dust removing device shown in FIGS. 9A and 9B was produced by using the multilayered piezoelectric element of Example 26. Plastic beads were dispersed on a surface of a diaphragm, and an alternating voltage was applied. As a result, a good dust removal ratio was confirmed.

Example 39

An image pickup device shown in FIG. 12 was produced by using the dust removing device of Example 38. When the image pickup device was operated, dust adhering to a surface of an image pickup unit was satisfactorily removed and an image without dust defects was obtained.

Example 40

An electronic apparatus shown in FIG. 14 was produced by using the multilayered piezoelectric element of Example 26. The operation of the speaker in response to an application of an alternating voltage was confirmed.

The piezoelectric material and the piezoelectric element according to embodiments of the present invention have a high piezoelectric constant in a wide operating temperature range. Furthermore, the piezoelectric material and the piezoelectric element do not contain lead and thus place little load on the environment. Accordingly, the piezoelectric element according to an embodiment of the present invention can be used without problems in piezoelectric apparatuses such as a liquid ejection head, a liquid ejection apparatus, an ultrasonic motor, an optical apparatus, a vibration apparatus, a dust removing device, an image pickup device, and an electronic apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-261504 filed Dec. 18, 2013, which is hereby incorporated by reference herein in its entirety.

What is claimed is:

1. A piezoelectric material comprising:
   a perovskite-type metal oxide represented by general formula (1) as a main component:

$(Ba_{1-x-y}Ca_xSn_y)_\alpha(Ti_{1-z}Zr_z)O_3$  General formula (1)

(where $0.020 \leq x \leq 0.200$, $0.020 \leq y \leq 0.200$, $0.050 < z \leq 0.085$, $0.986 \leq \alpha \leq 1.100$),
   wherein a valence of Sn is divalent.

2. The piezoelectric material according to claim 1, further comprising:
   0.04 parts by weight or more and 0.40 parts by weight or less of Mn in terms of metal as a sub-component relative to 100 parts by weight of the metal oxide.

3. The piezoelectric material according to claim 1, further comprising:
   0.10 parts by weight or less of Mg in terms of metal as a sub-component relative to 100 parts by weight of the metal oxide.

4. The piezoelectric material according to claim 1, wherein, in general formula (1), a relationship $0.055 \leq z \leq 0.085$ is satisfied.

5. The piezoelectric material according to claim 1, wherein a depolarization temperature of the piezoelectric material is 100° C. or higher.

6. The piezoelectric material according to claim 1, wherein crystal grains of the piezoelectric material have an average equivalent circle diameter of 0.3 μm or more and 10 μm or less.

7. The piezoelectric material according to claim 1, wherein a relative density of the piezoelectric material is 93% or more and 100% or less.

8. A piezoelectric element comprising:
   a first electrode;
   a piezoelectric material portion; and
   a second electrode, wherein the piezoelectric material portion is composed of the piezoelectric material according to claim 1.

9. The piezoelectric element according to claim 8, wherein the piezoelectric material portion has a region sandwiched between the first electrode and the second electrode, and a part or the whole of the region has remanent polarization.

10. A multilayered piezoelectric element comprising:
a plurality of piezoelectric material layers; and
a plurality of electrode layers including an internal electrode, the piezoelectric material layers and the electrode layers being alternately stacked,
wherein the piezoelectric material layers are composed of the piezoelectric material according to claim 1.

11. The multilayered piezoelectric element according to claim 10, wherein the piezoelectric material layers each have a region sandwiched between the electrode layers, and a part or the whole of the region has remanent polarization.

12. The multilayered piezoelectric element according to claim 11, wherein, among the plurality of piezoelectric material layers, any piezoelectric material layer and an adjacent piezoelectric material layer have opposite directions of remanent polarization with respect to a direction in which the piezoelectric material layers are stacked.

13. The multilayered piezoelectric element according to claim 10,
wherein the internal electrode contains Ag and Pd and has a weight ratio M1/M2 of a content weight M1 of Ag to a content weight M2 of Pd satisfying a relationship $0.25 \leq M1/M2 \leq 4.0$.

14. The multilayered piezoelectric element according to claim 10, wherein the internal electrode contains at least one of Ni and Cu.

15. A liquid ejection head comprising:
a liquid chamber including a vibration unit that includes the piezoelectric element according to claim 8; and
an ejection port in communication with the liquid chamber.

16. A liquid ejection apparatus comprising:
a stage configured to receive an object; and
the liquid ejection head according to claim 15.

17. An ultrasonic motor comprising:
a vibrating member that includes the piezoelectric element according to claim 8; and
a moving member that is in contact with the vibrating member.

18. An optical apparatus comprising:
a driving unit including the ultrasonic motor according to claim 17.

19. A vibration apparatus comprising:
a vibrating member including
a diaphragm, and
the piezoelectric element according to claim 8, the piezoelectric element being disposed on the diaphragm.

20. A dust removing device comprising:
a vibration unit including the vibration apparatus according to claim 19.

21. An image pickup device comprising:
the dust removing device according to claim 20; and
an image pickup element unit,
wherein a diaphragm of the dust removing device is disposed on a light-receiving surface side of the image pickup element unit.

22. An electronic apparatus comprising:
the piezoelectric element according to claim 8.

23. A liquid ejection head comprising:
a liquid chamber including a vibration unit that includes the multilayered piezoelectric element according to claim 10; and
an ejection port in communication with the liquid chamber.

24. A liquid ejection apparatus comprising:
a stage configured to receive an object; and
the liquid ejection head according to claim 23.

25. An ultrasonic motor comprising:
a vibrating member that includes the multilayered piezoelectric element according to claim 10; and
a moving member that is in contact with the vibrating member.

26. An optical apparatus comprising:
a driving unit including the ultrasonic motor according to claim 25.

27. A vibration apparatus comprising:
a vibrating member including
a diaphragm, and
the multilayered piezoelectric element according to claim 10, the multilayered piezoelectric element being disposed on the diaphragm.

28. A dust removing device comprising:
a vibration unit including the vibration apparatus according to claim 27.

29. An image pickup device comprising:
the dust removing device according to claim 28; and
an image pickup element unit,
wherein a diaphragm of the dust removing device is disposed on a light-receiving surface side of the image pickup element unit.

30. An electronic apparatus comprising:
the multilayered piezoelectric element according to claim 10.

* * * * *